(12) United States Patent
Anderson et al.

(10) Patent No.: US 8,115,251 B2
(45) Date of Patent: Feb. 14, 2012

(54) RECESSED GATE CHANNEL WITH LOW VT CORNER

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 656 days.

(21) Appl. No.: 11/741,898

(22) Filed: Apr. 30, 2007

(65) Prior Publication Data

US 2008/0268588 A1  Oct. 30, 2008

(51) Int. Cl.
*H01L 29/66* (2006.01)

(52) U.S. Cl. .......................... 257/330; 257/332; 438/270

(58) Field of Classification Search .................. 438/259, 438/270, 271; 257/332, 330
See application file for complete search history.

(56) References Cited

U.S. PATENT DOCUMENTS

| | | | | |
|---|---|---|---|---|
| 4,455,740 A | * | 6/1984 | Iwai ............................... | 438/270 |
| 6,107,650 A | * | 8/2000 | Takahashi et al. ............ | 257/139 |
| 6,555,872 B1 | * | 4/2003 | Dennen ......................... | 257/327 |
| 2007/0108469 A1 | * | 5/2007 | Nakano et al. ................ | 257/139 |

* cited by examiner

*Primary Examiner* — Thanh V Pham
*Assistant Examiner* — Caleb Henry
(74) *Attorney, Agent, or Firm* — Scully, Scott, Murphy & Presser, P.C.; Richard M. Kotulak, Esq.

(57) ABSTRACT

A recessed gate FET device includes a substrate having an upper and lower portions, the lower portion having a reduced concentration of dopant material than the upper portion; a trench-type gate electrode defining a surrounding channel region and having a gate dielectric material layer lining and including a conductive material having a top surface recessed to reduce overlap capacitance with respect to the source and drain diffusion regions formed at an upper substrate surface at either side of the gate electrode. There is optionally formed halo implants at either side of and abutting the gate electrode, each halo implants extending below the source and drain diffusions into the channel region. Additionally, highly doped source and drain extension regions are formed that provide a low resistance path from the source and drain diffusion regions to the channel region. The recessed gate FET device suppresses short channel effects and exhibits improved threshold voltage (Vt) characteristics at corners of the trench bottom.

20 Claims, 17 Drawing Sheets

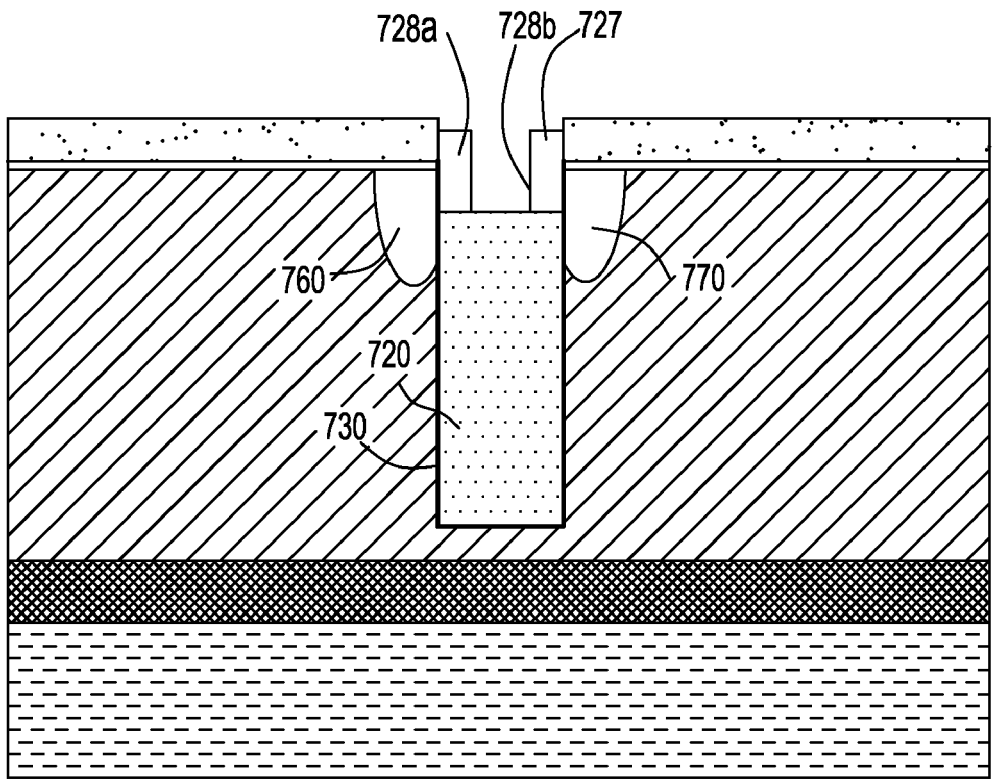
FIG. 7E
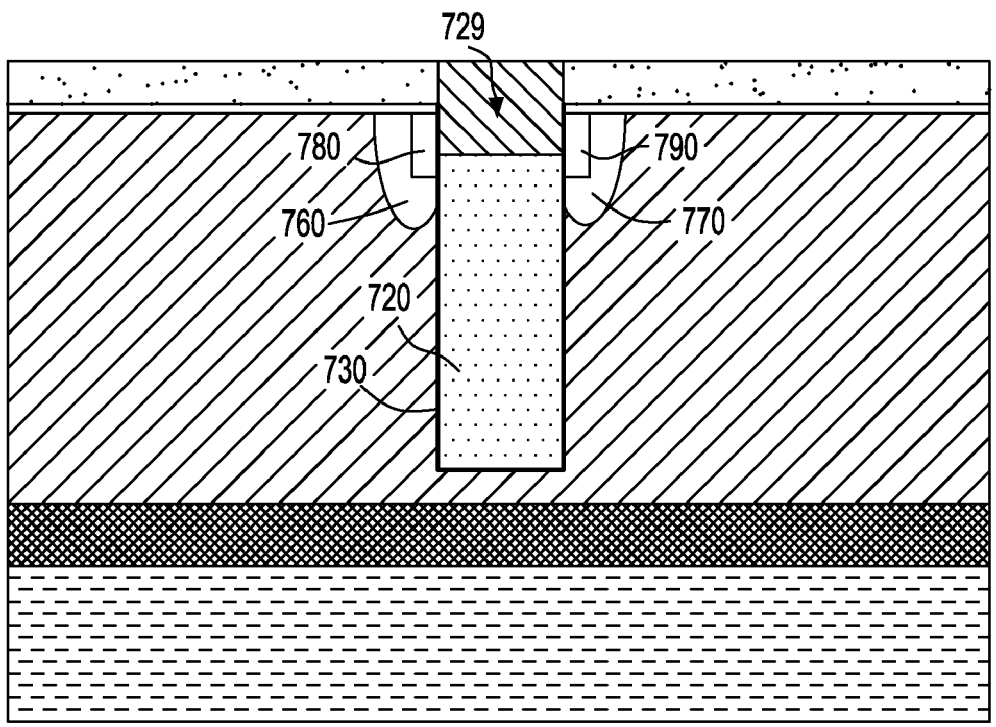
FIG. 7E(1)

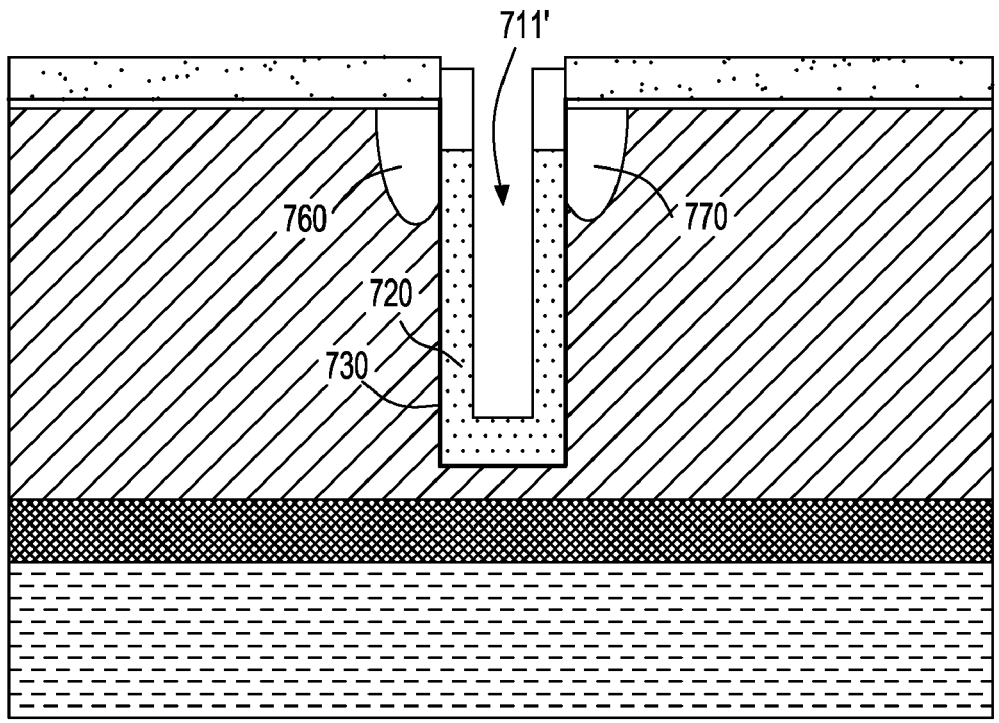
FIG. 7F
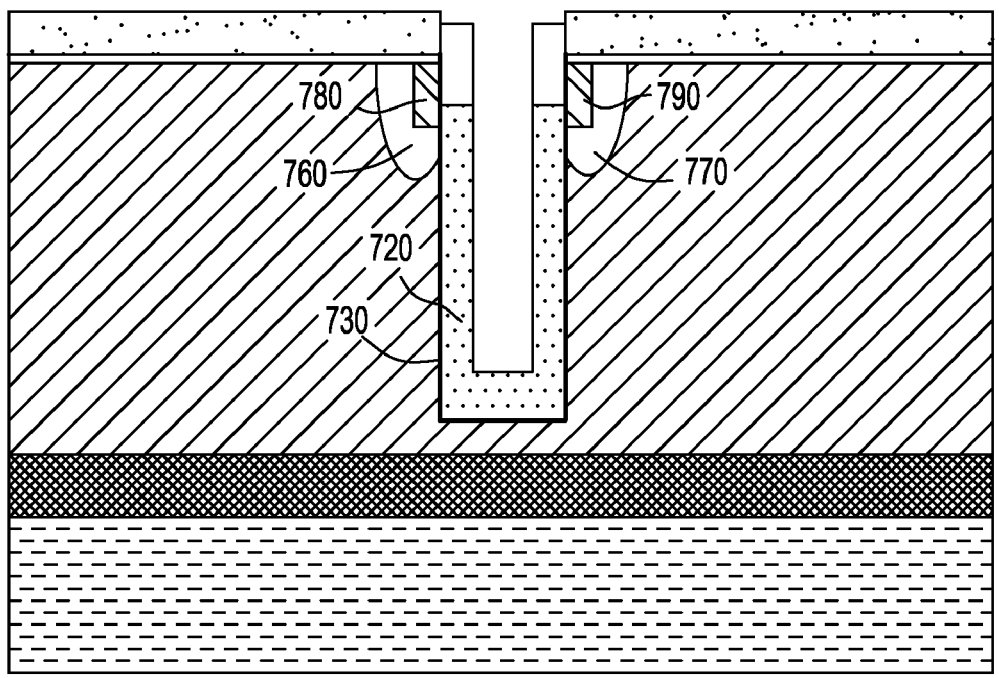
FIG. 7F(1)

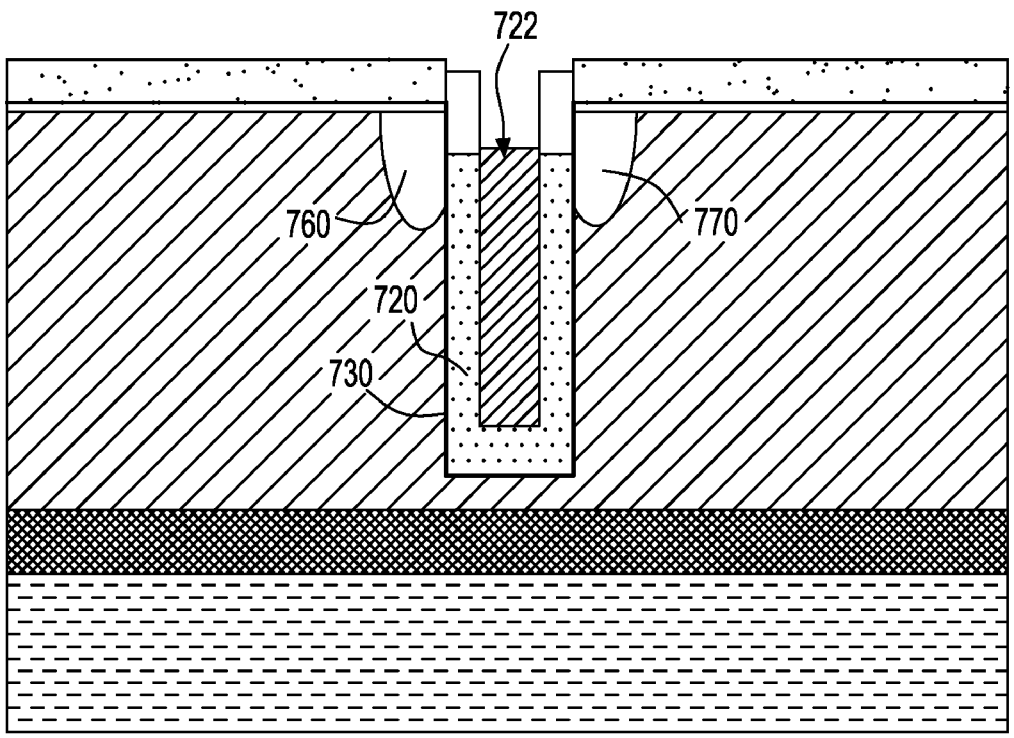
FIG. 7G
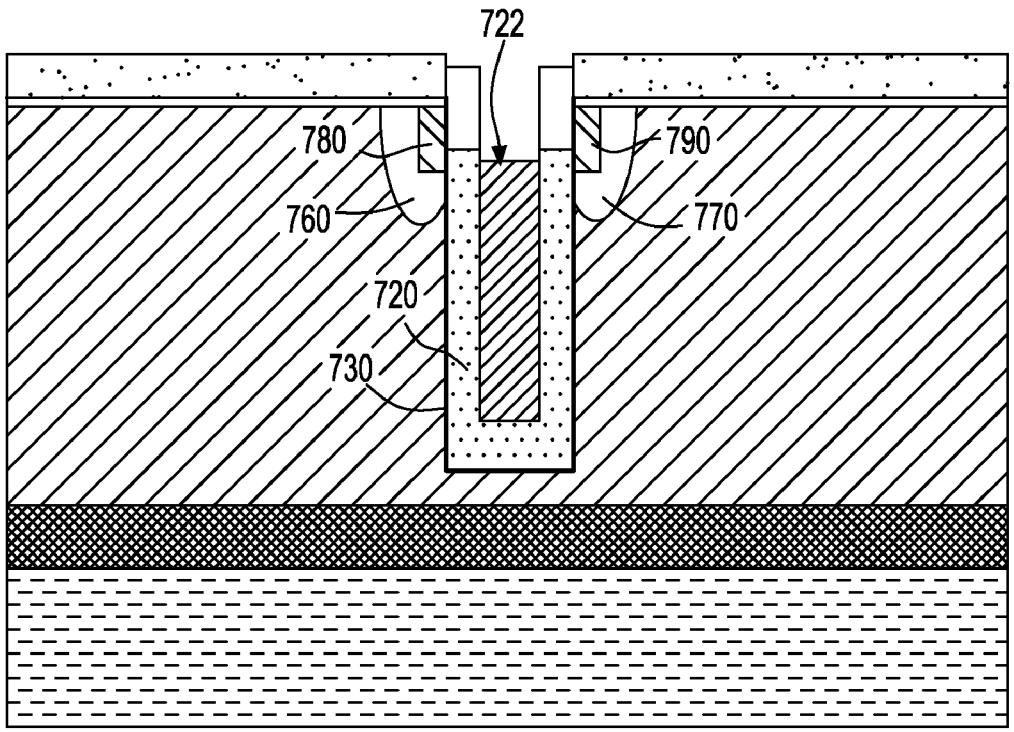
FIG. 7G(1)

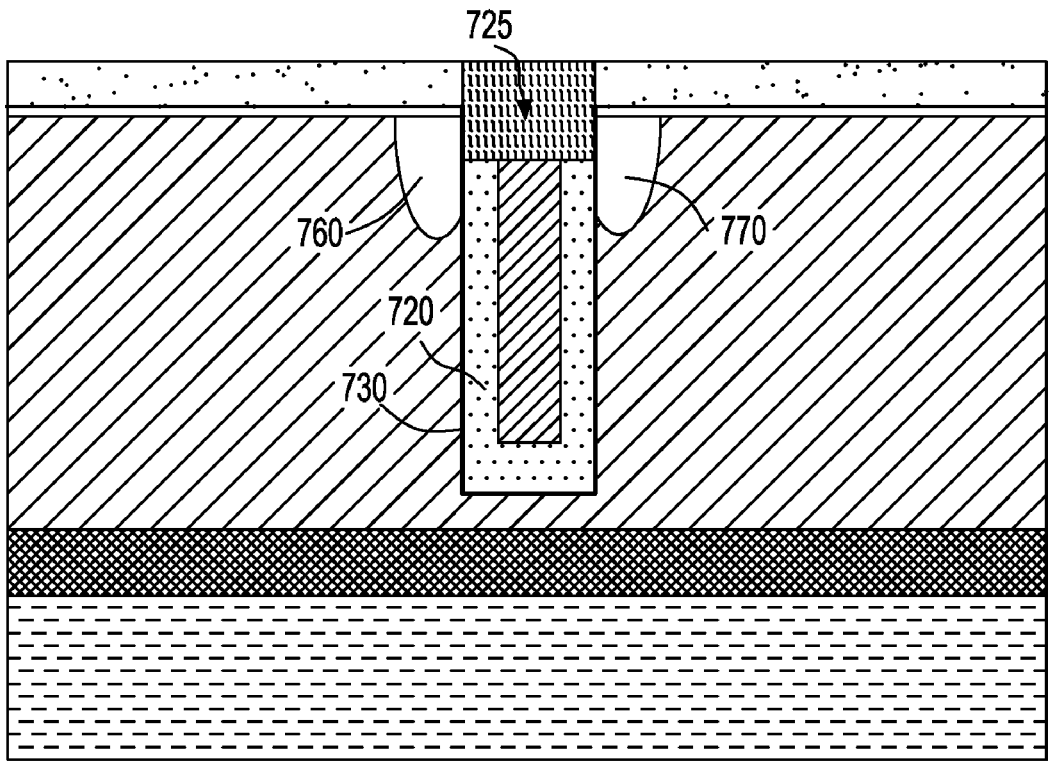
FIG. 7H
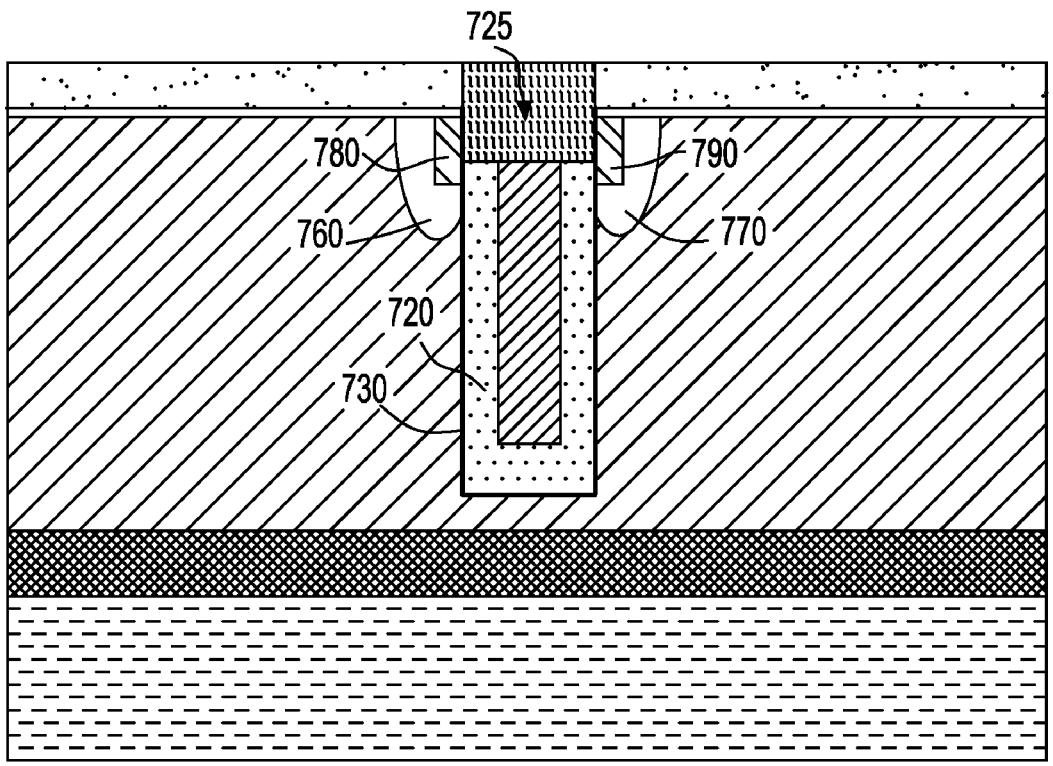
FIG. 7H(1)

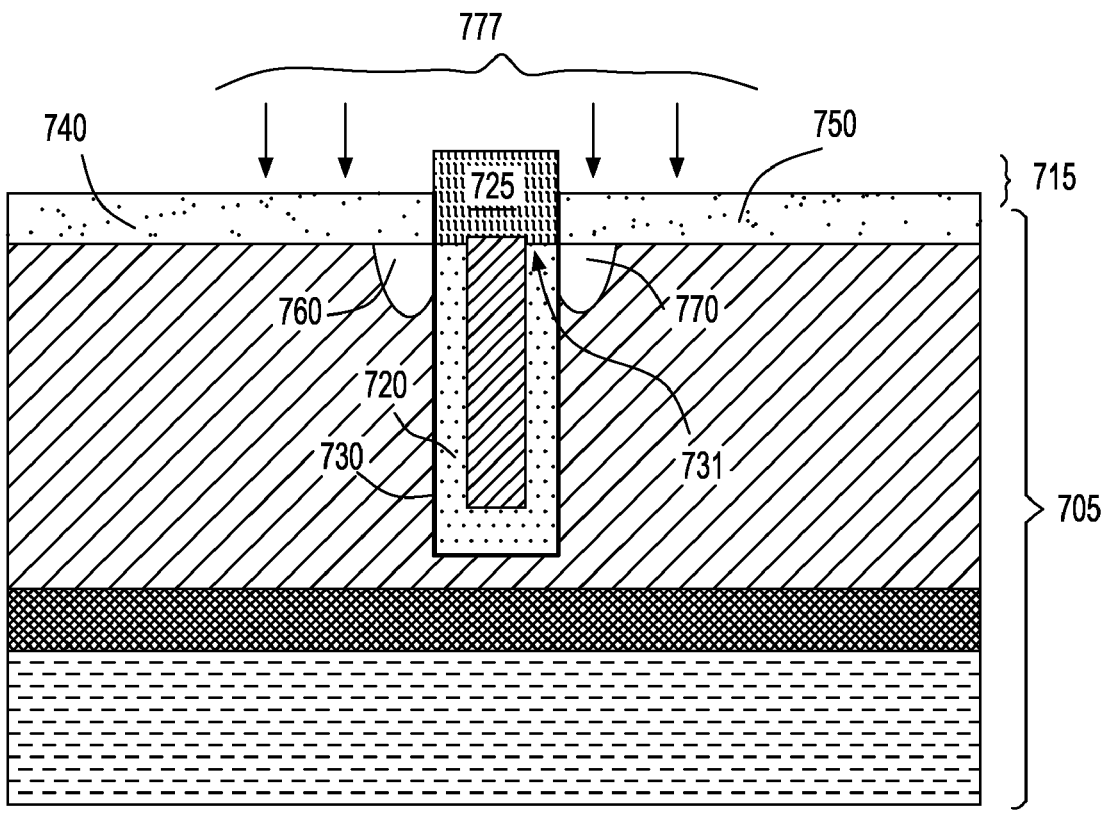
FIG. 7I
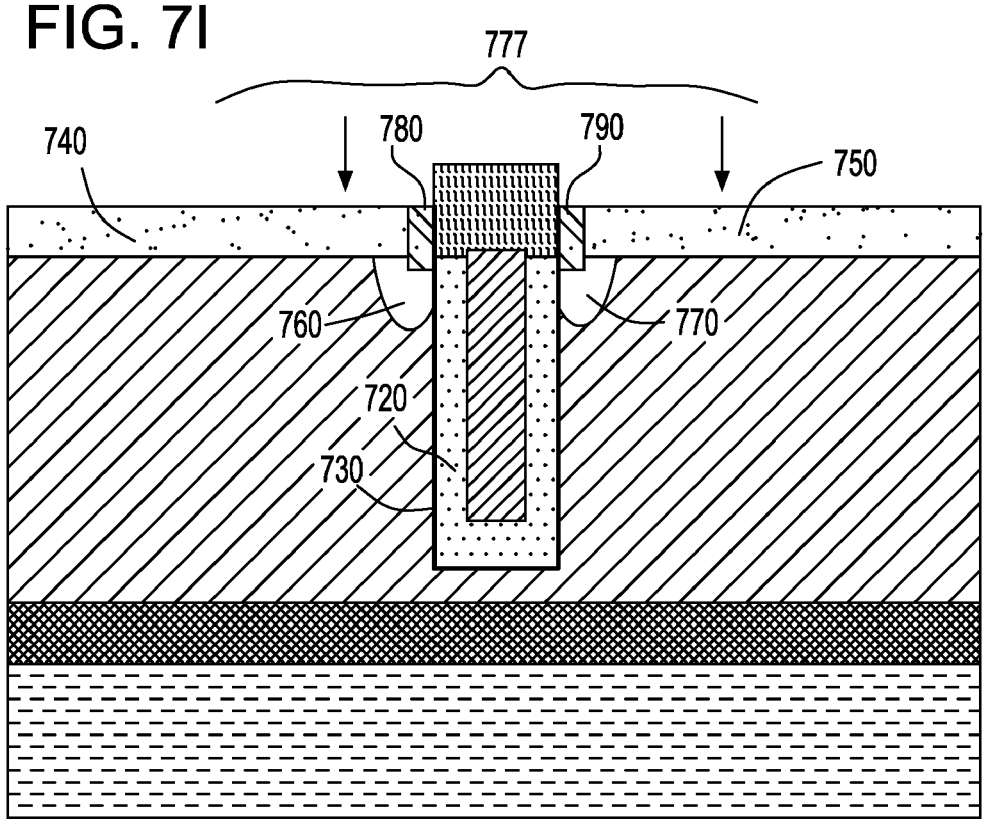
FIG. 7I(1)

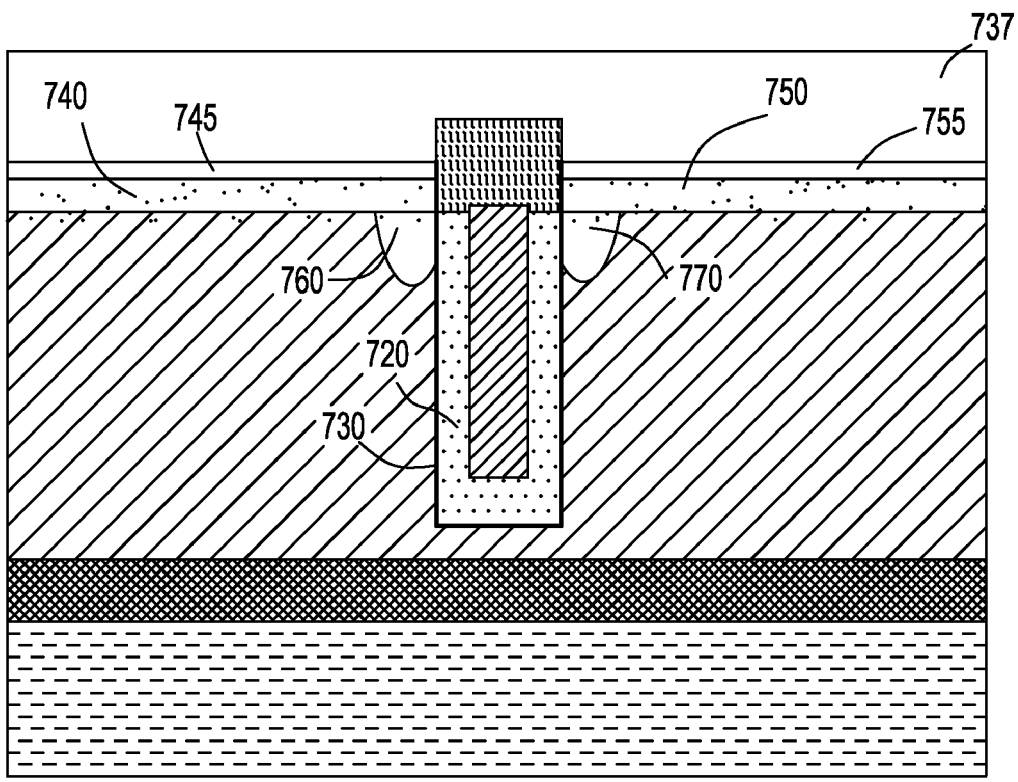
FIG. 7J
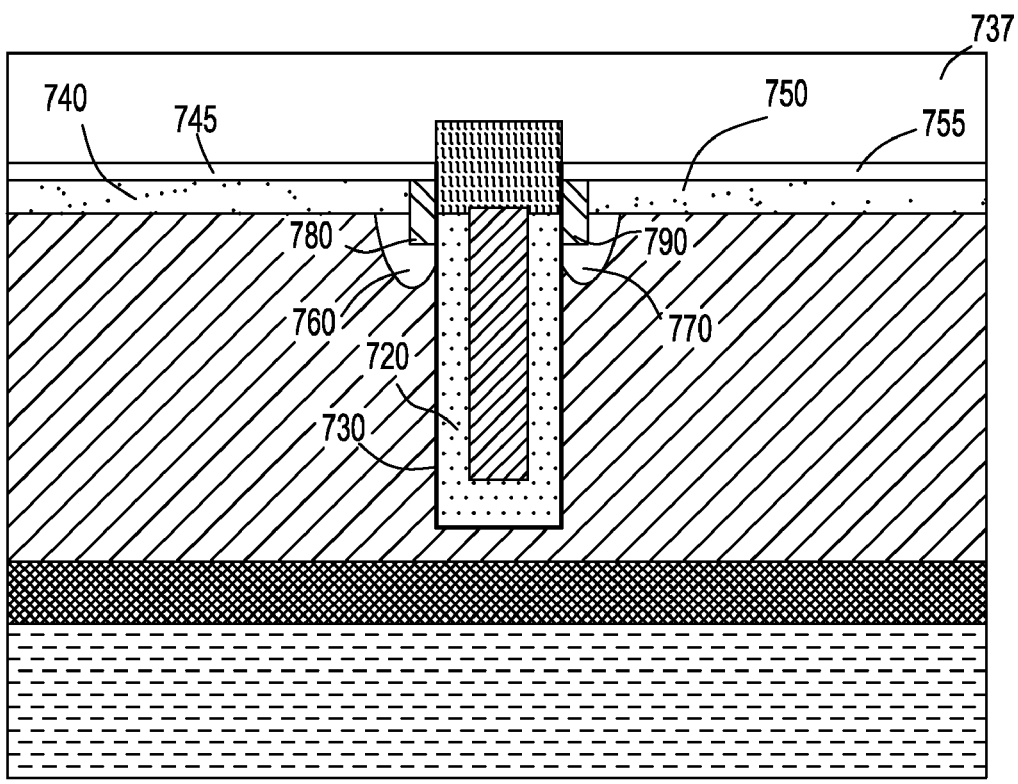
FIG. 7J(1)

RECESSED GATE CHANNEL WITH LOW VT CORNER

FIELD OF THE INVENTION

The present invention related generally to the fabrication of semiconductor CMOS devices, and more particularly, to an FET device structure and method of manufacture, the FET device having a recessed gate structure with a low corner Vt, for improved suppression of short channel effects.

BACKGROUND OF THE INVENTION

The dimensions of semiconductor field effect transistors (FETs) have been steadily shrinking over the last thirty 30 years or so, as scaling to smaller dimensions leads to continuing device performance improvements. Planar FET devices have a conducting gate electrode positioned above a semiconducting channel, and electrically isolated from the channel by a thin layer of gate oxide. Current through the channel is controlled by applying voltage to the conducting gate.

Scaling CMOS technology beyond the 65 nm node is resulting in a conflict between the gate length required for optimum power-limited performance and the gate length required to fit on contacted pitch, with this latter requirement being exceeded by the former design point.

Use of a recessed channel has been proposed but associated with the recessed channel structure is the problem of convex channel corners which have poor transport properties due to geometry-augmented Vt.

That is, as shown in FIG. 1A, which depicts, through a cross-sectional view, a prior art CMOS FET device 10 formed on a heavily doped substrate 12 having a recessed gate electrode (gate conductor) 15 extending from the wafer surface to a depth below the surface, a gate insulator layer 16 surrounding the gate conductor, and, source region 22 and drain region 24 on each side of the recessed gate channel, each convex channel corner 17, 18, such as seen in current devices having such recessed channel structures, results in intrinsically elevated Vt locally at the corner regions of the recessed gate conductor due to electric field non-uniformities (e.g., spreading) from the gate electrode to the channel. This structure degrades device operation and reliability. One prior-art solution to this corner problem is to selectively dope the corners to make them conductive around the corners.

For example, as shown in FIG. 1B, which depicts, through a cross-sectional view, a prior art CMOS FET device 10' formed on a heavily doped substrate 12 having a recessed gate electrode (gate conductor) 15 extending from the wafer surface to a depth below the surface, a gate insulator layer 16 surrounding the gate conductor, and, source region 22 and drain region 24 on each side of the recessed gate channel, each convex channel corner each corner 17, 18 is "short circuited" with heavy dopant concentrations 27, 28 respectively, in the substrate as known in the art. That is, the doping in the recessed gate corners 17,18 is intended to 'short-circuit' the corners so that, in effect, there were three channels in series, separated by the 'floating' intermediate sources at each corner. A high dose ion implant diffusion was applied to the corner regions 17, 18 in the prior art device shown in FIG. 1B, achieving doping concentrations on the order of about $1 \times 10^{20}$ cm$^{-3}$.

However, it is the case that such high-doped corner diffusions degrade the FET devices short channel effects (SCE) and introduce history, even when formed in bulk silicon.

A simpler solution than that discussed in the prior art which better improves suppression of short-channel effects than the prior art would be highly desirable.

Moreover, it is the case that providing long-channel length FETs that physically fit within contacted pitch has been shown to benefit performance. Thus, it would further be desirable to provide a novel FET device structure and method of manufacture whereby the device gate is recessed, however, does not result in the undesirable short channel effects (SCE); and further, to making long-channel length FETs that physically fit within contacted pitch to benefit performance.

SUMMARY OF THE INVENTION

This invention provides a novel semiconductor device structures designed to solve many performance-related problems for power-limited high-speed or low-power CMOS.

According to one aspect of the invention, a novel FET device is provided having a recessed gate structure that renders the device more reliable and better performing than prior art recessed channel gate FET devices by eliminating undesirable short channel effects (SCE).

More particularly, according to the various embodiments of the invention, the recessed gate FET device structure includes a low-Vt corner to fit longer channel lengths in finite space and exhibits improved performance as compared to prior art designs by additionally: 1. providing the ability to control the overlap capacitance (i.e. disclose a replacement for the role played by spacers in planar CMOS), 2. maintaining low via (CA) resistance without adding excessive gate-to-via capacitance, 3. introducing a gate-edge halo to benefit junction capacitance; and, 4. introducing a structure with source and drain regions orthogonal to the gate.

According to one aspect of the invention, there is provided a recessed gate FET comprising:

a substrate having an upper doped portion and a lower doped portion beneath a substrate surface, the lower doped portion having reduced concentration of dopant material than the upper doped portion;

a gate electrode formed as a trench beneath the substrate surface and defining a channel region surrounding the gate electrode, the gate electrode having a dielectric material surrounding the sidewalls and bottom of the trench, and having a conductive material deposited therein, a top surface of the conductive material being recessed from an upper substrate surface;

source and drain diffusion regions formed at either side of the gate electrode at the substrate surface; and, doped pocket regions formed at either side of and abutting the gate electrode, each doped pocket region extending below the source and drain diffusions into the channel region, wherein a bottom portion of the trench is formed in the lower doped portion of the substrate, the recessed gate FET thereby exhibiting improved suppression of short channel effects.

Further to this aspect of the invention, the recessed gate FET further comprises: extension regions of highly doped material formed adjacent an upper portion of the gate electrode within the optionally formed doped pocket regions formed at either side of the gate electrode to provide a low resistance path to the channel region from a respective formed source diffusion and drain diffusion.

The doped pocket regions may comprise self-aligned halo implant regions formed beneath drain and source diffusions adjacent a length of the recessed gate trench. Further, the formed source and drain extensions are self-aligned to further enhance channel conductivity for the recessed gate.

According to a further aspect of the invention, there is provided a recessed gate FET comprising:

a substrate having an upper doped portion and a lower doped portion beneath a substrate surface, the lower doped portion having reduced concentration of dopant material than the upper doped portion;

a gate electrode formed as a trench beneath the substrate surface and defining a channel region surrounding the gate electrode, the gate electrode having a dielectric material surrounding the sidewalls and bottom of the trench, and having a conductive material deposited therein, a top surface of the conductive material being recessed from an upper substrate surface;

source and drain diffusion regions formed at either side of the gate electrode at the substrate surface;

source and drain extension regions of highly doped material formed adjacent an upper portion of the gate electrode at either side of the gate electrode to provide a low resistance path to the channel from a respective formed source diffusion and drain diffusion, wherein a bottom portion of the trench is formed in the lower doped portion of the substrate, the recessed gate FET thereby exhibiting improved suppression of short channel effects.

According to this aspect of the invention, the recessed gate FET further comprises: optional doped pocket regions formed at either side of and abutting said gate electrode, each optional doped pocket region extending below said source and drain diffusions in said channel region, wherein said source and drain extension regions of highly doped material are formed within said doped pocket regions at either side of said gate electrode.

According to a further aspect of the invention, there is provided a method for forming a recessed gate FET comprising the steps of:

providing a semiconductor substrate having an upper doped portion and a lower doped portion beneath a substrate surface, the lower doped portion having reduced concentration of dopant material than the upper doped portion; forming a trench in the substrate to define a gate electrode and a channel region surrounding the gate electrode, a bottom corner of the trench extending into the lower doped portion of the substrate;

lining sidewalls and bottom portions of the trench with dielectric material layer;

filling the trench with a material to form a gate conductor;

recessing the gate conductor below a substrate surface to define an opening at an upper portion of the trench, optionally forming doped pocket regions at either side of and abutting the gate electrode, each doped pocket region extending into the channel region, providing a dielectric cap in the formed opening; and, forming source and drain diffusion regions at either side of the gate electrode at the substrate surface that contact respective formed doped pocket regions, wherein a bottom portion of the trench is formed in the lower doped portion of the substrate, the recessed gate FET thereby exhibiting improved suppression of short channel effects.

Further to this aspect of the invention, prior to the providing a dielectric cap in the formed opening, a step of: forming extension regions of highly doped material adjacent an upper portion of the gate electrode within the optionally formed doped pocket regions at either side of the gate electrode to provide a low resistance path to the channel region from a respective formed source diffusion and drain diffusion region.

According to yet a further aspect of the invention, there is provided a method for forming a recessed gate FET comprising the steps of:

providing a semiconductor substrate having an upper doped portion and a lower doped portion beneath a substrate surface, the lower doped portion having reduced concentration of dopant material than the upper doped portion;

providing a thin dielectric layer atop an upper surface of the substrate;

forming a trench in the substrate to define a gate electrode and a channel region surrounding the gate electrode, a bottom corner of the trench extending into the lower doped portion of the substrate;

filling the trench with sacrificial dielectric material;

recessing a portion of the sacrificial dielectric material to a depth below a substrate surface to form an opening in an upper trench portion of the gate electrode;

forming extension regions of highly doped material adjacent the upper trench portion of the gate electrode;

removing the sacrificial dielectric material from the trench;

thermally growing a gate dielectric material layer that lines the sidewall and bottom of the trench;

filling the dielectric material lined trench with a conductor material to form a gate conductor;

recessing the gate conductor below a substrate surface to define an opening at an upper portion of the trench, providing a dielectric cap in the formed opening; and, forming source and drain diffusion regions at either side of the gate electrode at the substrate surface that contact respective extension regions, the extension regions providing a low resistance path from respective source and drain diffusions to the channel region, wherein a bottom portion of the trench is formed in the lower doped portion of the substrate, the recessed gate FET thereby exhibiting improved suppression of short channel effects.

Further to this aspect of the invention, prior to the providing a dielectric cap in the formed recessed gate FET, the forming extension regions of highly doped material adjacent the upper trench portion of the gate electrode comprises:

providing highly doped material in the formed opening; and, outdiffusing dopant material to form the extensions adjacent an upper portion of the gate electrode.

Advantageously, in each of the various embodiments of the invention, the recessed gate device may be formed on a very thin SOI structure, the very thin silicon typically resulting in very few dopant atoms nearby the corner, which lowers Vt and can counter the intrinsic Vt increase from the corner. This thin SOI effect is not an intrinsic geometry effect, however, but is simply a result associated with fewer dopant atoms associated with thin silicon.

BRIEF DESCRIPTION OF THE DRAWINGS

The objects, features and advantages of the present invention will become apparent to one skilled in the art, in view of the following detailed description taken in combination with the attached drawings, in which:

FIGS. 7A-7J depict, through cross-sectional views, a method of fabricating the recessed gate FET devices 400, 400' and 500, 500' according to first and second embodiments of the invention, and, FIGS. 8A-8E depict, through cross-sectional views, a method of fabricating the recessed gate FET device 800 according to a further embodiment of the invention.

DETAILED DESCRIPTION OF THE PREFERRED EMBODIMENTS

Figure 1A:
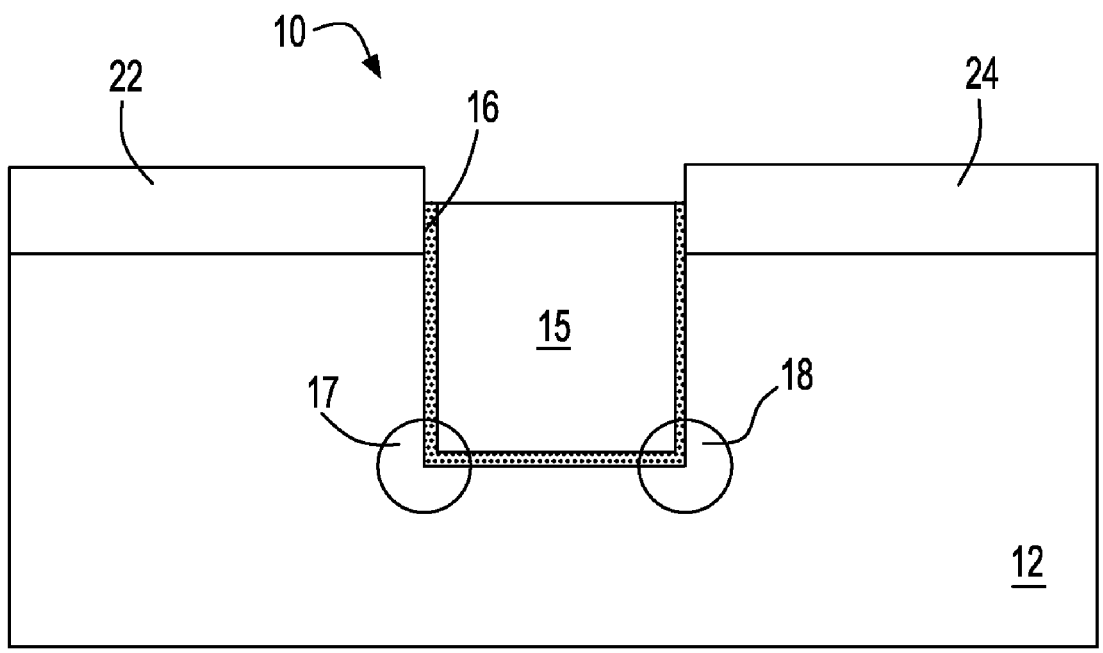
FIGS. 1A and 1B depict prior art FET devices having a recessed gate structure.
Figure 1B:
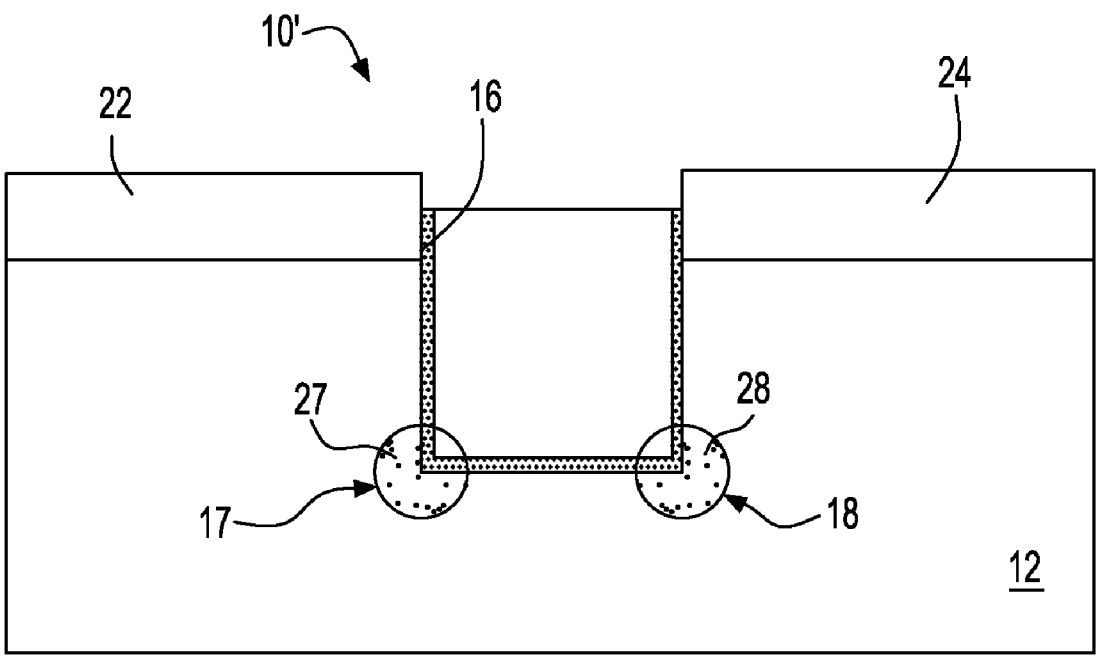
Figure 2A:
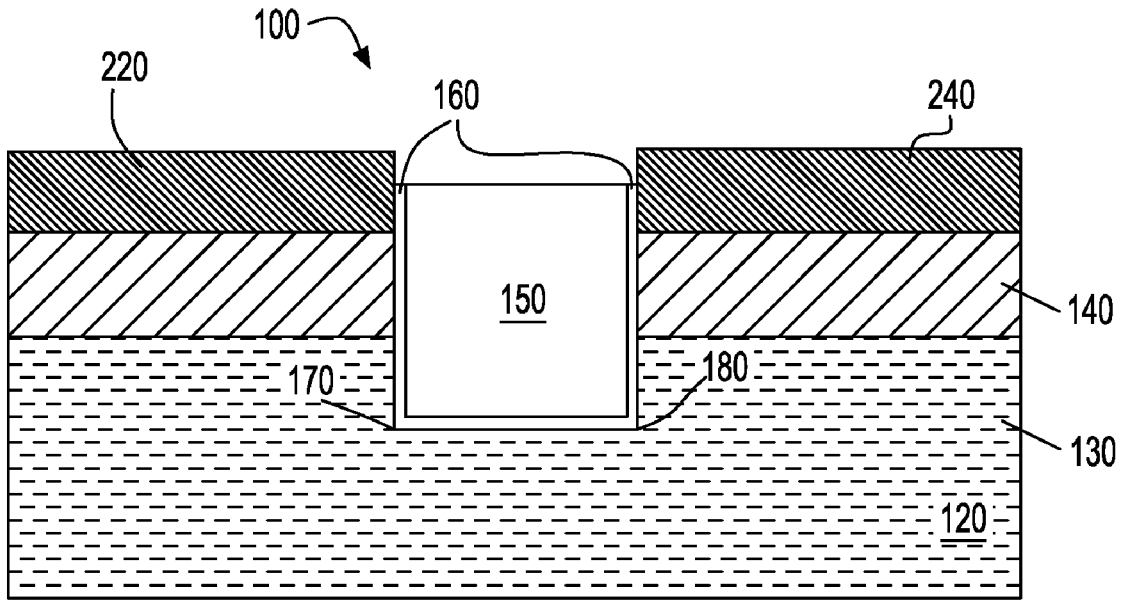
FIGS. 2A and 2B illustrate the FET devices having a recessed gate structure according to a first and alternate first embodiments of the present invention.

FIG. 2A illustrates the FET device structure 100 having a recessed gate 150 according to a first embodiment of the present invention. As shown in FIG. 2A, the FET device structure 100 is formed on a substrate 120 having a lower low doped substrate layer 130 of a first thickness and a very high doped body layer 140 of a second thickness formed on top such that the recessed gate 150 includes sidewalls extending through the high-doped body layer 140 with the corner regions 170, 180 of the device formed in the lower low doped substrate layer 130. The substrate 120 may comprise a bulk semiconductor substrate including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 120 is a Si-containing semiconductor substrate including a first layer 130 lightly doped with material of a first conductivity type, e.g., lightly doped with p-type dopant material. For a nFET device 100, such dopant material includes boron or indium applied such that the dopant concentration at the respective recessed gate corners 170 and 180 are typically at or below $10^{16}$ cm$^{-3}$. For a pFET device 100, such dopant material includes arsenic or phosphorus.

In forming the device 100 having the structure depicted in FIG. 2A, the bulk substrate is first exposed and subjected to implantation and annealing using conditions that are well known to those skilled in the art so as to form well regions (not specifically shown) in the exposed portions of the substrate. For example, the channel region which may comprise single crystal silicon adjacent to the gate dielectric 160 on the gate sidewalls, is the highly doped body, and is typically doped to a concentration ranging anywhere from about $6 \times 10^{18}$ cm$^{-3}$ to $3 \times 10^{19}$ cm$^{-3}$ both to adjust Vt and to control short-channel effects. That is, layer 140 is formed by ion implantation (of boron for nFETs, arsenic or phosphorus for pFETs) prior to formation of the gate and extends below the top surface of the substrate.

Then, using standard processing techniques, a gate trench recess is formed in the substrate. That is, utilizing a trench lithography, a photoresist mask (not shown) is applied, patterned and developed to expose an open region for forming a gate trench. Subsequently, an etch process is performed through the opening in the mask to form a gate trench recess that extends down below the substrate surface to a depth of about 10 nm to 200 nm or, at least to a depth such that the recessed corner regions of the gate are formed in the lower doped substrate layer 130. The trench recess formed according to this process has a width of about 5 nm to 100 nm transfer gate features or, at least the width range commensurate with present day 0.18 micron technology node processing. For prior device functioning in accordance with the present invention, the gate and respective corner regions 170, 180 extend to a depth within the lower doped substrate layer 130.

Subsequent to the formation of the trench, a sacrificial oxide is grown on and removed from the exposed silicon surfaces inside the trench, and a dielectric material layer 160 is formed on the surface of the Si-containing semiconductor substrate and on the sidewalls and bottom surface of trench by using a suitable deposition process such as chemical vapor deposition, plasma-assisted chemical vapor deposition, evaporation, sputtering and other like deposition processes. Although it is not shown, it is understood that the dielectric layer may comprise a stack of dielectric materials. Alternatively, gate dielectric 160 may be formed by a thermal oxidation, nitridation or oxynitridation process. Combinations of the aforementioned processes may also be used in forming the gate dielectric. The gate dielectric 160 may be composed of any conventional dielectric material including, but not limited to: $SiO_2$, $Si_3N_4$, SiON, $TiO_2$, $Al_2O_3$, $ZrO_2$, $HfO_2$, $Ta_2O_5$, and $La_2O_3$. Gate dielectric 160 may also comprise any combination of the aforementioned dielectric materials.

Next, a conductor material is deposited to fill the trench and form a gate layer above the gate dielectric layer 160 using conventional deposition processes including, but not limited to: CVD, plasma-assisted CVD, sputtering, plating, evaporation and other like deposition processes (e.g., a low pressure CVD) followed by planarization and recessing. This layer may be comprised of any conductive material including, but not limited to: polysilicon; a conductive elemental metal such as W, Cu, Pt, Ag, Au, Ru, Ir, Rh, and Re; alloys that include at least one of the aforementioned conductive elemental metals; silicide or nitrides that include at least one of the above-mentioned conductive elemental metals; and combinations thereof. When a combination of conductive materials is employed, an optional diffusion barrier material such as TaN or WN may be formed between the conductive materials. For purposes of description, an intrinsic polysilicon layer is used. When a polysilicon gate conductor is employed, the polysilicon gate conductor is formed by deposition, planarization, ion implantation and annealing. The annealing conditions used at this point of the present invention in forming the polySi gate conductor may vary. Exemplary annealing conditions that may be employed in the present invention include: 1000° C. for 5 seconds.

It is understood that for proper nFET operation, for example, polysilicon gate 150, must be doped with the second conductivity type, e.g. n-type, to a concentration in the range of 1019 cm$^{-3}$ to $10^{21}$ cm$^{-3}$. This may be accomplished by the standard practice of utilizing the implants or by predoping the polysilicon before etch, or by using insitu doped polysilicon.

Regardless of whether or not the formed gate polysilicon layer 150 is doped subsequently by ion implantation or, in-situ doped and deposited, the gate 150 of the FET device 100 is formed to result in the structure as shown in FIG. 2A. Next, further conventional techniques may be utilized to form the source and drain diffusion regions 220, 240, typically with protective sacrificial spacer elements formed at either side of the gate by conventional deposition processes well known in the art prior to implanting the source drain diffusions 220, 240. For purposes of description, for an nFET device, active n+-type dopant material is ion implanted at the diffusion regions at dosing concentrations ranging between $1\times10^{19}$ cm$^{-3}$ and $1\times10^{21}$ cm$^{-3}$.

There are several variations to this first embodiment invention that can add value to the basic idea shown and described with respect to FIG. 2A. For instance, it should be understood that the present invention contemplates gate recessed portions formation of varying shapes and sizes by a variety of known techniques. That is, the depth of the gate 150 is variable such as long as the lower gate corners extend in the lower doped substrate layer portion 130. Furthermore, the width of the gate 150 with respect to the recess trench is variable. Moreover, the channel can be made longer by forming more tapered grooves in succession.

Figure 2B:
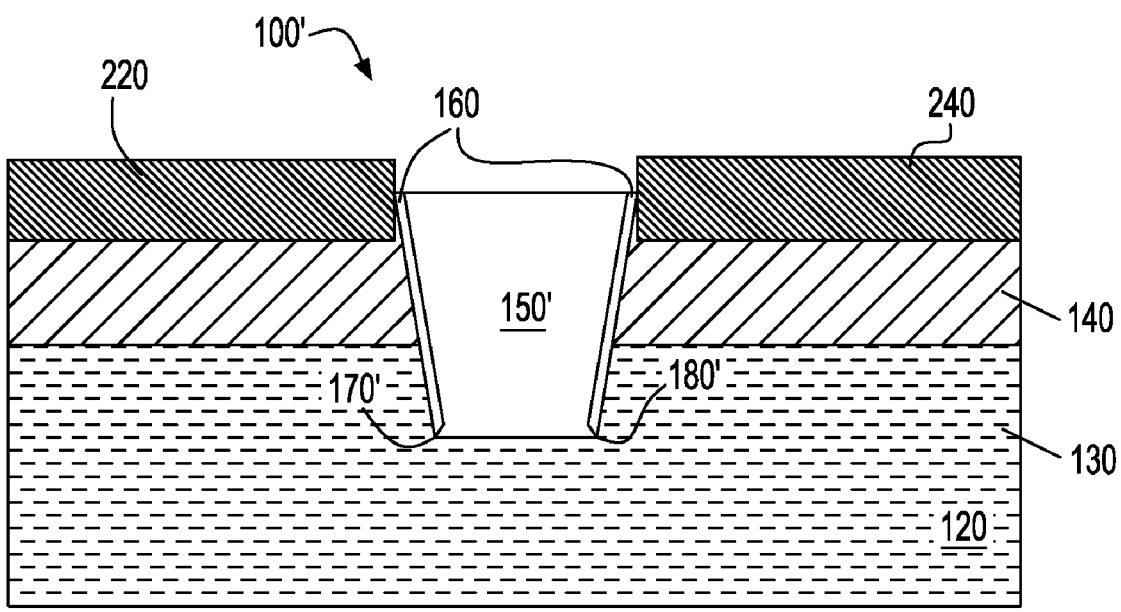

Thus, in a second alternate embodiment of the invention, as shown as device 100' in FIG. 2B, a gate 150' may be fabricated that includes a "V" shaped trench recess portion which, as known to skilled artisans, may be created by implementing a substrate wet etch process, e.g., that will stop on the <111> crystallographic plane which will provide about a 54.7 degree angle between the sidewall angle of the "V" and the surface, to form the "V" shaped trench recess having lower concave corner portions 170', 180' which may be beneficial for surface state reduction as known in the art. It is understood that the degree of taper of trench 150' can be between 0 degrees (none) to about 45 degrees. Aligning the taper to principle planes of the semiconductor (such as {110}, {111} et cetera) is advantageous.

Figure 3A:
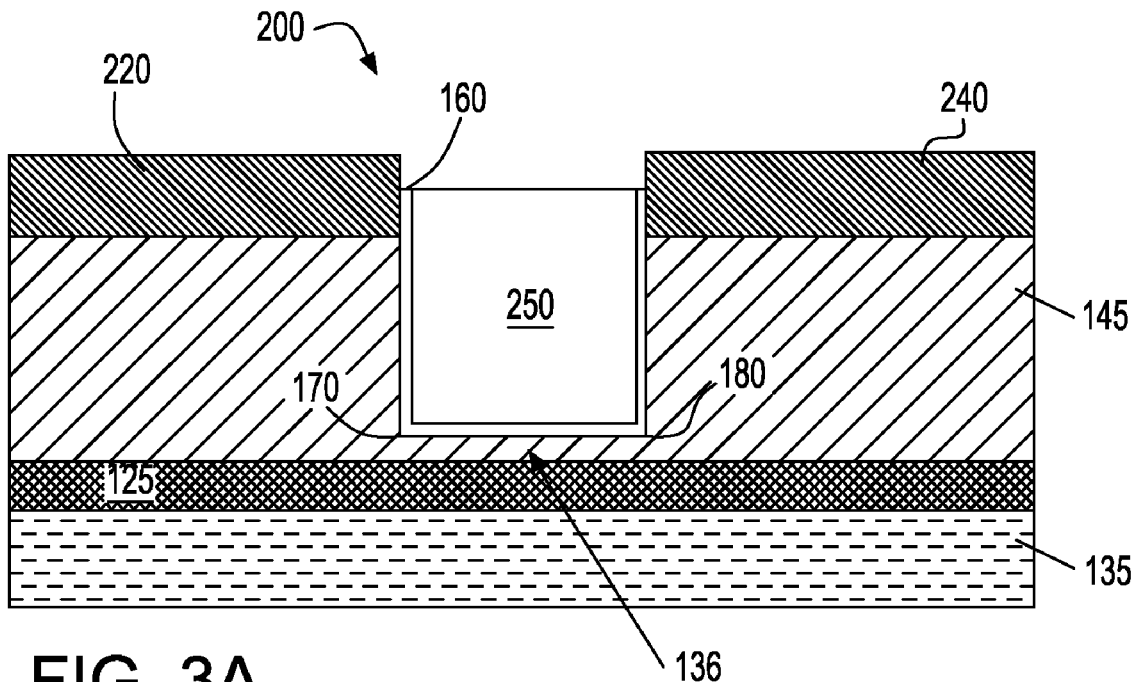
FIGS. 3A and 3B illustrate the FET devices having a recessed gate structure according to a second and alternate second embodiments of the present invention.

FIG. 3A illustrates the FET device structure 200 having a recessed gate 250 according to a second embodiment of the present invention. As shown in FIG. 3A, the FET device structure 100 is formed on a Silicon-On-Insulator (SOI) structure that includes an insulating layer 125, i.e., buried oxide region (BOX), that electrically isolates a top Si-containing layer 145 from a bottom Si-containing layer 135. The top Si-containing, i.e., the SOI layer, serves as the area in which electronic devices such as the MOSFETs of the invention can be fabricated.

The SOI structure shown in FIG. 3A is fabricated using techniques well known to those skilled in the art. For example, the SOI structure illustrated in FIG. 4 may be formed by a thermal bonding process, or alternatively, the SOI structure may be formed by an oxygen implantation process which is referred to in the art as a separation by implantation of oxygen (SIMOX) process. In some embodiments, the SOI structure is formed by depositing or thermally growing an insulating layer atop a surface of a Si-containing substrate and thereafter depositing a top Si-containing layer on a surface of the previously deposited insulating layer.

The top Si-containing layer of the SOI structure (hereinafter SOI layer 145) may have a thickness depending upon the technique used in forming the same, however, typically, SOI layer 145 has a vertical thickness of from about 10 to about 250 nm. The SOI layers may comprise each of the materials described above with a dopant range for the upper Si-containing SOI substrate layer 145 at about $5\times10^{15}$ cm$^{-3}$ to about $6\times10^{18}$ cm$^{-3}$ however, may be doped to concentrations ranging anywhere from about $1\times10^{15}$ cm$^{-3}$ to $3\times10^{19}$ cm$^{-3}$, as in the first embodiment of the invention, both to adjust Vt and to control short-channel effects. The thickness of the underlying insulating layer 125 and bottom Si-containing layer 135 is not critical to this embodiment of the present invention.

As shown in FIG. 3A, the bottom surface of the trench gate is extends to a depth such that an ultra-thin silicon layer 136 is present that separates the bottom portion of the recessed gate conductor and the top surface of the underlying BOX layer 125. The ultra-thin silicon portion 136 may range anywhere from between 1 nm and 20 nm thickness for optimal device performance. However, it could fall between 3 nm and 50 nm with lighter doping silicon, e.g., on the order of $1\times10^{18}$ cm$^{-3}$ or less. In this very thin SOI embodiment of the invention, the very thin silicon layer 136 will (typically) result in very few dopant atoms nearby the corners of the recessed gate 250, which lowers Vt and can counter the intrinsic Vt increase from the corner. This thin SOI effect is not really an intrinsic geometry effect, however, but is simply a result associated with fewer dopant atoms associated with thin silicon.

As will be explained in greater detail herein, the thin film SOI MOSFETs in which the top Si-containing layer has a reduced thickness, e.g., of about 50 nm or less, are of special interest as they are compatible with 45 nm or later technologies, and compatible with trench aspect ratios that are in the range between 1:2 and 2:1; such aspect ratios are most easily controlled, processed, and filled. Despite the known advantages with thin film SOI technology, processing challenges exist which substantially hamper the use of ultra-thin film SOI MOSFETs in semiconductor integrated circuits. For example, prior art processes for fabricating thin film SOI MOSFETs have difficulty in forming a thin (20 nm or less) SOI channel region, while simultaneously being able to maintain abutting thick SOI source and drain regions. Thick source and drain regions are desirable since they permit the formation of a low sheet resistance silicide layer.

Thus, in some alternative structures of the SOI embodiment depicted in FIG. 3A, when the SOI layer 145 has an initial thickness of greater than 50 nm, it may be necessary to thin the SOI layer 145 from its initial thickness to a predetermined thickness that is about 50 nm or less. This optional thinning step of the present invention is carried out using a technique well known to those skilled in the art. For example, the SOI layer may be thinned by chemical-mechanical polishing (CMP), grinding or a combination of thermal oxidation and etching. When thermal oxidation and etching are employed to thin SOI layer 145, the etching step may be carried out using any conventional dry etching process such as reactive-ion etching, ion beam etching or plasma-etching.

Figure 3B:
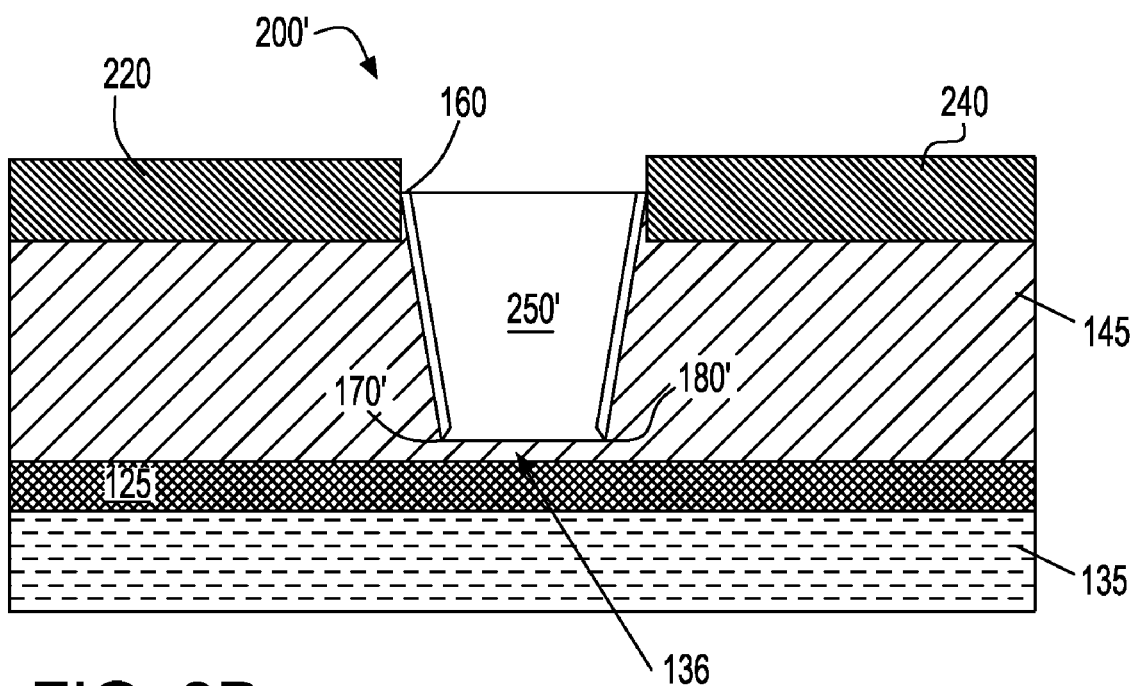

In an alternate second embodiment of the invention, as shown as device 200' in FIG. 3B, a gate 250' may be fabricated that includes a "V" shaped trench recess portion which, as known to skilled artisans, may be created by implementing a substrate wet etch process, e.g., that will stop on the <111> crystallographic plane which will provide about a 54.7 degree angle between the sidewall angle of the "V" and the surface, to form the "V" shaped trench recess having lower concave corner portions 170', 180' that extends down and formed above the BOX layer 125 resulting in a thin ultra-thin silicon portion 136 defined between the lower concave corner portions 170', 180' and BOX layer 125 as in the embodiment depicted in FIG. 3A. It is understood that the degree of taper of trench 250' can be between 0 degrees (none) to about 45 degrees. Aligning the taper to principle planes of the semiconductor (such as {110}, {111} etc.) is advantageous.

Figure 4A:
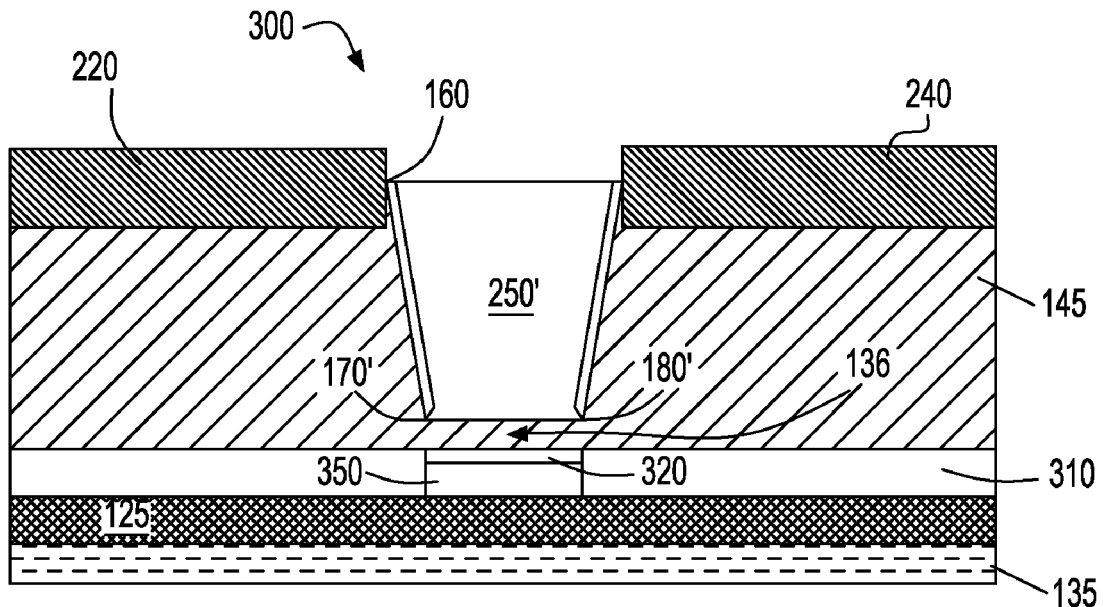
FIGS. 4A and 4B illustrate the FET devices having a recessed gate structure that is additionally backgated according to a further aspect of the present invention.

FIG. 4A illustrates a FET device structure 300 according to a third embodiment of the invention which includes the FET device structure 250' having "backgated" corners. That is, the device structure shown in FIG. 4A includes a recessed gate such as the recessed tapered trench gate 250', and is formed on a Silicon-On-Insulator (SOI) structure that includes an insulating layer 125, i.e., buried oxide region (BOX), and, a backgate isolation layer 310 formed on top of the insulating layer 125 and having a back gate portion 350 including a thin backgate dielectric, e.g., oxide layer, 320. The back gate isolation layer 310 is any suitable dielectric, typically silicon dioxide or silicon nitride. In this embodiment, the back-gate 350 is used to maximize back gate control in the ultra-thin undoped or lightly doped channel region 136, and may comprise a doped-polysilcon back gate electrode with p+doping and n+doping, or may comprise a refractory metal such a tungsten. Particularly, the back-gate 350 is used to lower the electric potential of the silicon channel at the corners 170', 180' by electrostatic induction, e.g., by biasing the back gate 350 with a low or negative voltage for an n-type FET, or high or positive voltage for a p-type FET, and hence provides control of the Vt at the bottom trench corners. Advantageously, in the embodiment described with respect to FIG. 4A, the back gate is isolated from the semiconductor substrate 135 by a dielectric layer, e.g., the buried isolating layer 125 of the SOI substrate. This particular structure permits unrestricted use of the back gate bias during operation since the back gates are isolated from the semiconductor substrate.

The backgate can be formed as a part of a Bond and Etch-back SOI (BESOI) process. Back-gate insulator 320 is grown or deposited on first (bulk) silicon wafer and can comprise a high quality gate dielectric such as silicon dioxide or oxynitride. A conductive material is next deposited and patterned to form back-gate 350. Optionally an isolation layer 310 comprising silicon dioxide, silicon nitride, or a combination of these materials is deposited, and optionally planarized to the top of the back-gate 350. Next a portion of silicon dioxide layer 125 is deposited. A second, substrate, wafer is next bonded to layer 125 and the assembly is inverted. The new top surface (formerly bottom surface of the first wafer) can now be thinned by well-known means such as etch-back, or by means of high-dose ion-implant followed by thermal annealing, splitting the top layer away, and final polishing. The now-exposed new top surface of the first wafer, now becomes the top surface of this BESOI wafer with back-gate structure upon which methods disclosed in alternate embodiments of this invention may now be employed, with trench(es) aligned over the back-gate 350.

Figure 4B:
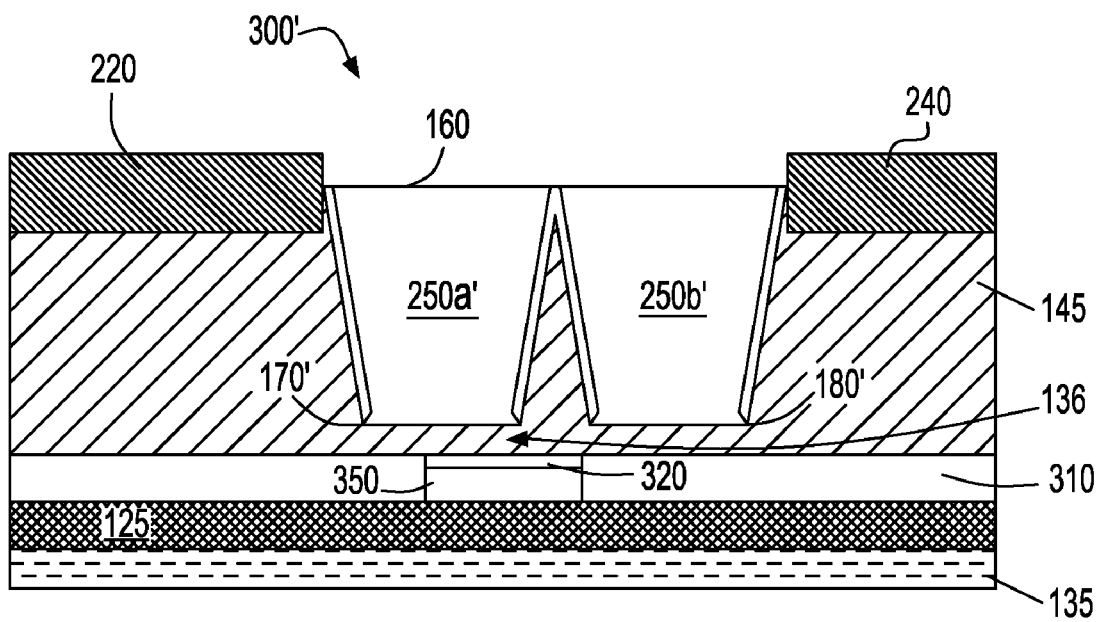

FIG. 4B illustrates an alternative FET device structure 300' according to the third embodiment of the invention which lengthens the channel by including a succession of FET gate structures 250', at least one of which having the "backgated" corners. That is, the device structure shown in FIG. 4B includes two abutting recessed tapered gate trench structures 250a' and 250b'. As shown in FIG. 4B both trench structures 250a' and 250b' are gated by back-gate 350 to ensure maximum control of the current by the back-gate bias, however, only one or some of the trenches could be back-gated in alternate embodiments.

The principles of the invention may be applied in the design of a recessed gate FET structure having low-Vt corner to fit longer channel lengths in finite space and which exhibits improved performance as compared to prior art designs. The method for fabricating such device additionally enables formation of self-aligned source and drain halo implants and, alternatively, with more heavily doped source and drain extensions.

Figure 5A:
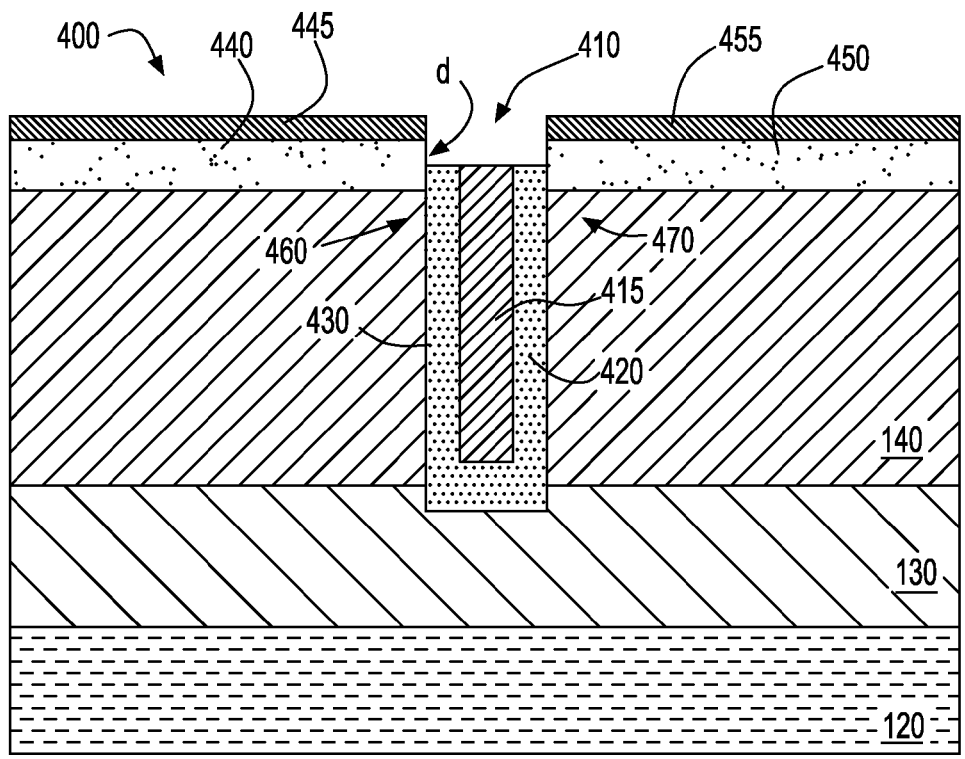
FIGS. 5A and 5B depict, through respective cross-sectional views, a recessed gate FET device 400, 400' according to a first embodiment and alternate first embodiments of the invention, respectively.

FIG. 5A depicts a recessed gate FET device 400 according to a first embodiment comprising a recessed gate electrode 410 formed in a substrate structure comprising bottom layer 130 and top layer 140, the bottom layer being slightly doped as in the embodiment of FIGS. 2A and 2B. That is, the doping concentration for the upper layer 140 ranges anywhere from about $6 \times 10^{18}$ cm$^{-3}$ to $3 \times 10^{19}$ cm$^{-3}$ and the lower layer dopant concentration is at or below $1 \times 10^{16}$ cm$^{-3}$ to advantageously adjust Vt and to control short-channel effects. Preferably, the gate electrode 410 is formed from a trench structure that extends vertically down beneath the substrate surface and includes a conductor material 420, e.g., metal, or doped or undoped polysilicon, surrounded by a thin layer of gate dielectric material 430. In one embodiment, the gate electrode 410 extends to a depth ranging between 10 nm to 200 nm and has a width ranging between 5 nm and 100 nm. The thin layer of gate dielectric material 430 ranges in thickness from between 1 nm to 20 nm and may comprise a high-K dielectric material, e.g., an oxide (e.g., SiO$_2$, nitride or oxynitride material. As seen in FIG. 5A, the top surface of the gate conductor material 420 is recessed a small distance "d" from the planar top surfaces of the respective source and drain diffusion regions 440, 450 of like dopant polarity and concentrations formed at either side of the gate at the surface. This recess "d" may range from about 5 nm to 50 nm in depth and adds performance benefits to the device as will be explained in greater detail herein. For purposes of illustration, the gate electrode is formed of polysilicon and in the embodiment described, a thin layer of a metal silicide 415 is formed at the gate electrode. Additionally, metal silicide layers 445, 455, are formed atop the respective source and drain diffusions. Additionally shown in FIG. 5A, the recessed gate FET device 400 includes self-aligned source and drain halo implant regions 460, 470, formed under each respective source and drain diffusion 440, 450, respectively, and adjacent the gate electrode 410, the increase the conductivity of the channel region.

Figure 5B:
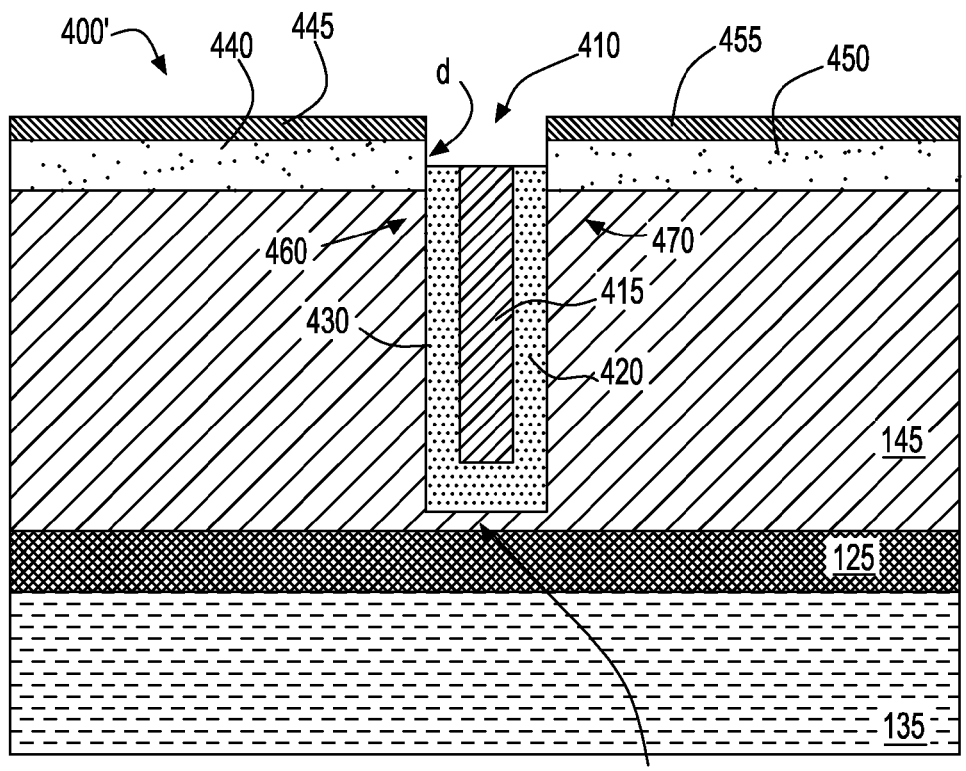

FIG. 5B depicts a recessed gate FET device 400' according to an alternate first embodiment comprising a recessed gate electrode 410 formed in an SOI substrate structure having comprising bottom silicon-containing layer 135, BOX layer 125 and top silicon-containing layer 145 as in the prior embodiments. In all aspects, the devices 400 of FIGS. 5A and 400' of FIG. 5B are the same; however, in FIG. 5B, the lower Vt corner regions are due to the thin silicon substrate portion 136 that underlies the bottom of the trench gate electrode 410 that is fully depleted in FIG. 5B and can counter the intrinsic Vt increase from the corner. In the embodiment, depicted in FIG. 5B, the very thin silicon portion 136 is about 35 nm in thickness or thinner. It is understood that in both embodiments of the recessed gate structure depicted in FIGS. 5A, 5B the gate is recessed below the top surface of the drain and source diffusions resulting in low overlap capacitance with respect to the source and drain diffusions and thereby reducing undesirable parasitic capacitances to increase device performance.

Figure 6A:
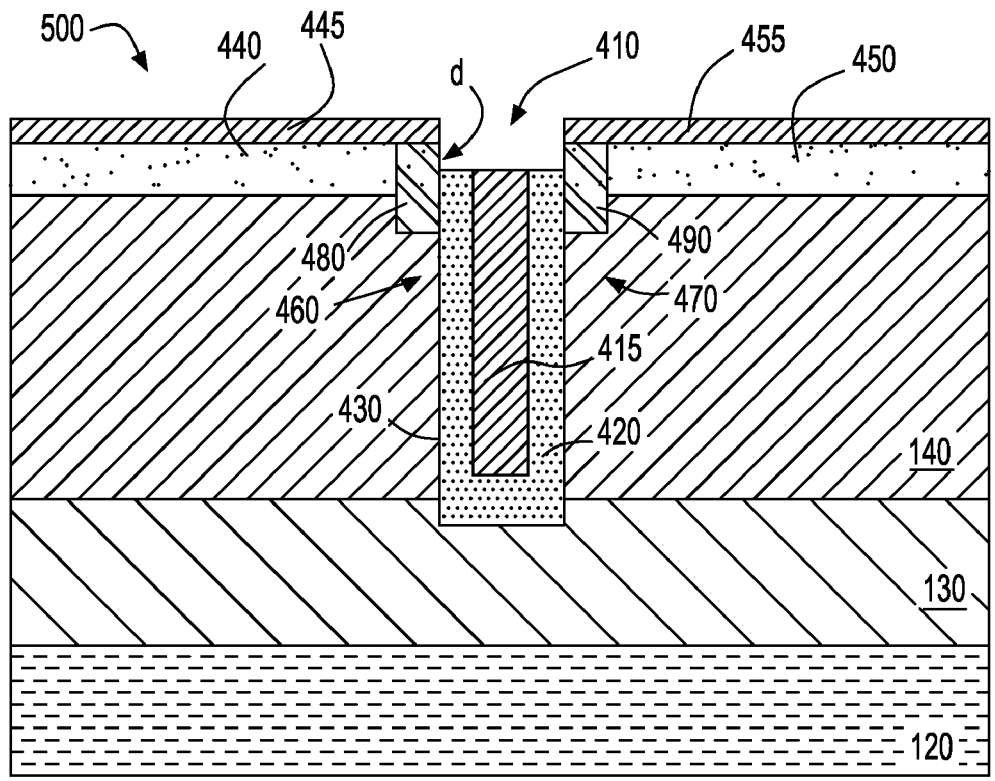
FIGS. 6A and 6B depict, through respective cross-sectional views, a recessed gate FET device 500, 500' according to a second embodiment and alternate second embodiments of the invention, respectively.

FIG. 6A depicts a recessed gate FET device 500 according to a second embodiment comprising a recessed gate electrode 410 formed in a substrate structure comprising bottom layer 130 and top layer 140, the bottom layer being slightly doped as in the embodiment of FIGS. 5A and 5B. The recessed gate FET device 500 of the second embodiment depicted in FIG. 6A is for purposes identical to the embodiment depicted in FIG. 5A, however, is provided with additional vertical self-aligned extensions 480, 490 that extend down from the respective source diffusion 440 and drain diffusion 450 and conductively contact the respective self-aligned source and drain halo implant (pocket doped) regions 460, 470.

Figure 6B:
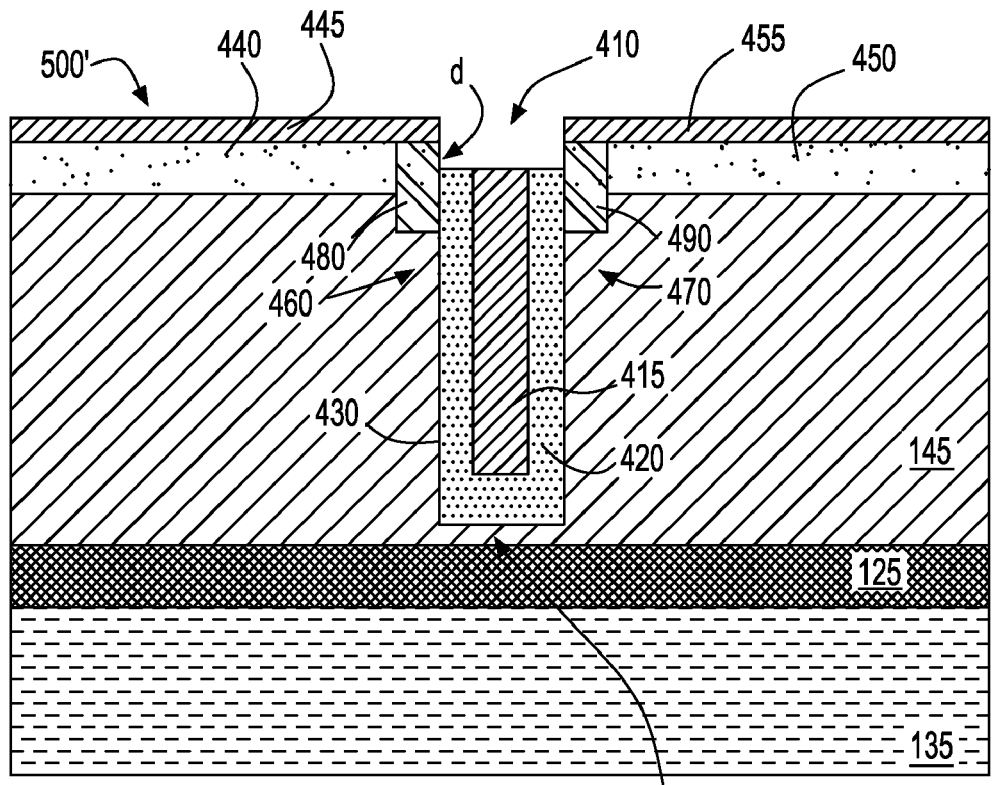

FIG. 6B depicts a recessed gate FET device 500' according to an alternate second embodiment comprising a recessed gate electrode 410 formed in an SOI substrate structure having comprising bottom silicon-containing layer 135, BOX layer 125 and top silicon-containing layer 145 as in the prior embodiments. In all aspects, the devices 500 of FIGS. 6A and 500' of FIG. 6B are the same; however, in FIG. 6B, the lower Vt corner regions are due to the thin silicon substrate portion 136 that underlies the bottom of the trench gate electrode 410 that is fully depleted in FIG. 6B. In the embodiment, depicted in FIG. 6B, the very thin silicon portion 136 is about 20 nm in thickness or thinner. It is understood that in both embodiments of the recessed gate structure depicted in FIGS. 6A, 6B the gate is recessed below the top surface of the drain and source diffusions as small distance "d" resulting in low overlap capacitance and increasing device performance.

It should be understood that in alternative embodiments depicted in FIGS. 5A, 5B, 6A and 6B, the formed gate electrode trenches may be fabricated to have a "V" shaped (i.e. tapered) trench recess profile which, as known to skilled artisans, may be created by implementing a substrate wet etch process to form the "V" shaped trench as described above with respect to FIGS. 2B, 3B, for example. Moreover, the embodiments described may comprise FET devices of both polarities, i.e., nFET and pFET.

A method for manufacturing the recessed gate FET devices shown in FIGS. 5A, 5B, 6A and 6B, is now described with respect to FIGS. 7A-7J. While the embodiment for the fabrication method 700 shown in FIGS. 7A-7J depict the SOI substrate embodiment, the method steps depicted are equally applicable for the bulk substrate embodiment as in FIG. 5A, 6A.

Figure 7A:
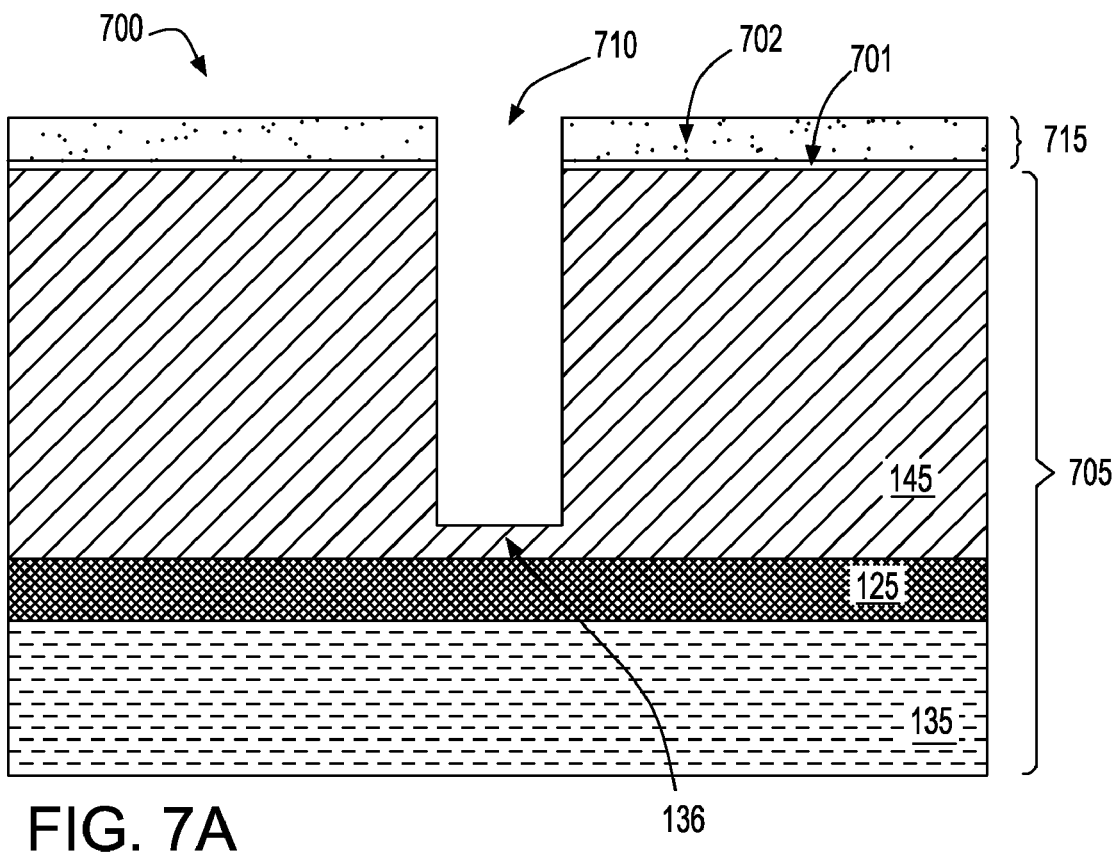

As shown in FIG. 7A, the method 700 includes first forming a SOI structure 705 having the structure, dimensions, material and doping characteristics as described hereinabove. Formed on top of the surface of SOI substrate 700 is a protective insulating layer 715 comprising a single layer or a stack of dielectric material. As shown in FIG. 7A, a stack comprising a thin pad oxide layer 701 of, for example, 10 nm-50 nm thick is first formed on the substrate surface by conventional deposition techniques. A layer of SiN or like pad nitride layer 702 is formed on top the pad oxide to a thickness of about 50 nm-300 nm. Then as shown, using conventional semiconductor lithographic techniques, a gate trench 710 is formed below the substrate surface having depth and width dimensions as described herein. It is understood that the depth of the trench is controlled such that a small thin layer 136, on the order of about 35 nm or less, remains between the bottom of the trench 710 and the top of the buried oxide layer 125.

Figure 7B:
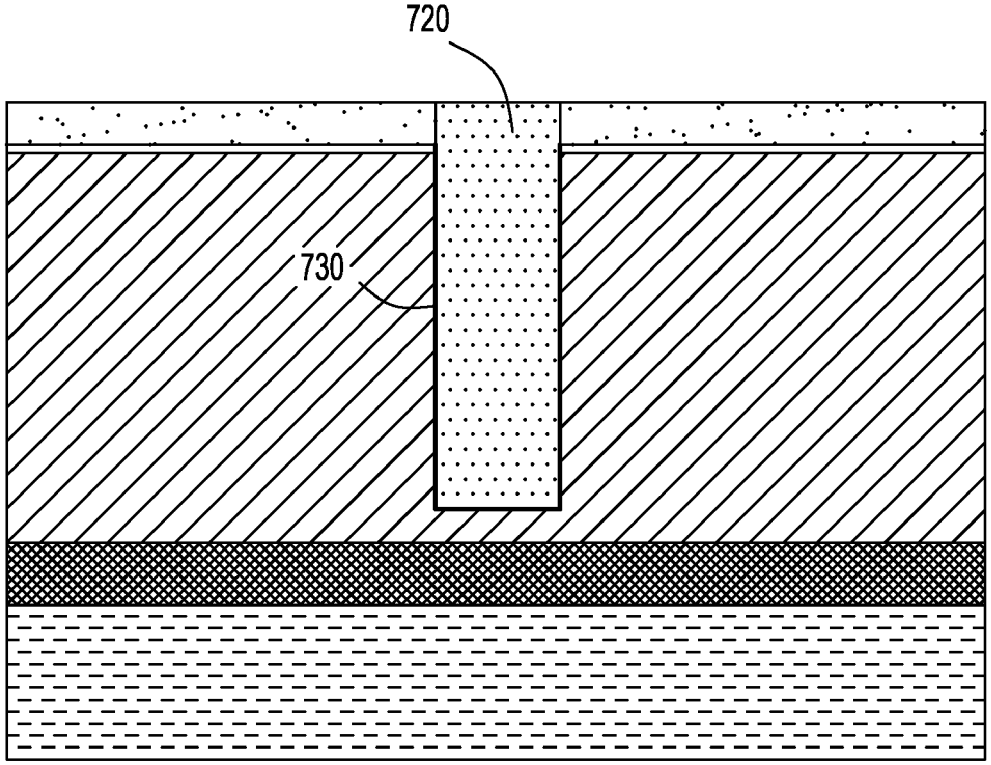

As shown in FIG. 7B, the next step includes lining the gate trench with a thin dielectric layer 730 that forms on the surface of the Si-containing semiconductor substrate and on the sidewalls and bottom surface of trench. The gate dielectric layer 730 of the recessed gate FET may be formed by using a suitable deposition process such as chemical vapor deposition, plasma-assisted chemical vapor deposition, evaporation, sputtering and other like deposition processes to a thickness of anywhere from 1 nm-20 nm. Although it is not shown, it is understood that the dielectric layer may comprise a stack of dielectric materials. Alternatively, gate dielectric 160 may be formed by a thermal oxidation, nitridation or oxynitridation process. Combinations of the aforementioned processes may also be used in forming the gate dielectric. The gate dielectric 730 may be composed of any conventional high-k dielectric material including, but not limited to: $SiO_2$, $Si_3N_4$, SiON, $TiO_2$, $Al_2O_3$, $ZrO_2$, $HfO_2$, $Ta_2O_5$, and $La_2O_3$. Gate dielectric 160 may also comprise any combination of the aforementioned dielectric materials.

As further shown in FIG. 7B, the gate trench 710 lined with gate dielectric material 730 is then filled with a conductive material to form the gate 720 using conventional deposition processes including, but not limited to: CVD, plasma-assisted CVD, sputtering, plating, evaporation and other like deposition processes (e.g., a low pressure CVD) followed by planarization and recessing. This layer may be comprised of any conductive material including, but not limited to: polysilicon; a conductive elemental metal such as W, Cu, Pt, Ag, Au, Ru, Ir, Rh, and Re; alloys that include at least one of the aforementioned conductive elemental metals; silicide or nitrides that include at least one of the above-mentioned conductive elemental metals; and combinations thereof. When a combination of conductive materials is employed, an optional diffusion barrier material such as TaN or WN may be formed between the conductive materials. For purposes of description, an intrinsic polysilicon layer is used. When a polysilicon gate conductor is employed, the polysilicon gate conductor is formed by deposition, planarization, ion implantation and annealing. The annealing conditions used at this point of the present invention in forming the polySi gate conductor may vary. Exemplary annealing conditions that may be employed in the present invention include: 1000° C. for 5 seconds. As shown in FIG. 7B, the deposited gate polysilicon 720 may be planarized to form a flat top surface.

Figure 7C:
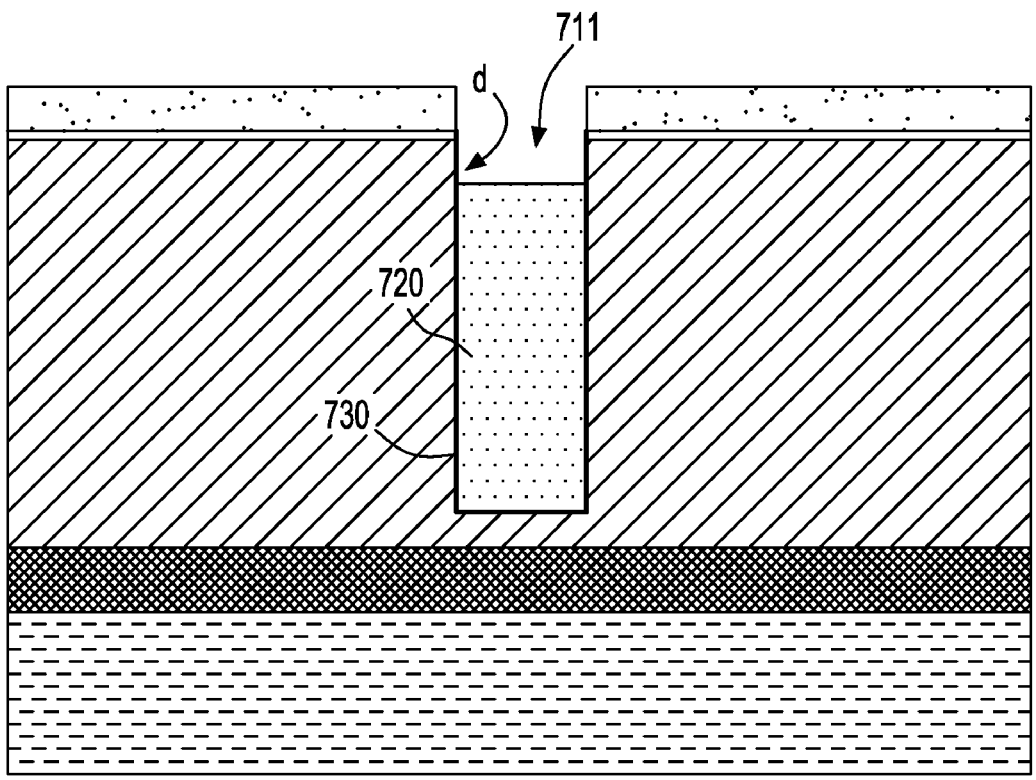
Figure 7D:
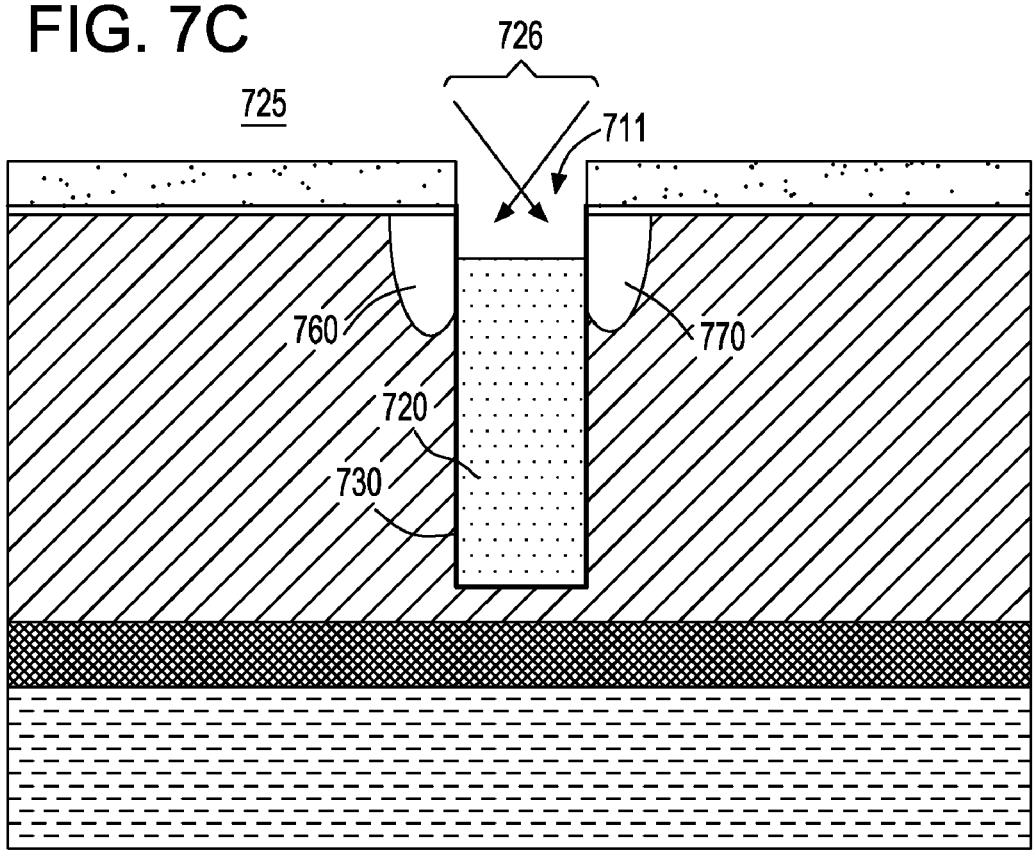

Continuing to FIG. 7C, the gate conductor 720 is recessed by conventional etch techniques such as Reactive Ion Etching (RIE) to a depth "d" of about 5 nm-50 nm below the top surface of the substrate to form an opening 711. Then as shown in FIG. 7D, an optional self-aligned halo implantation or pocket doping step 725 is performed whereby dopant atoms 726 are implanted through the opening 711 to form doped halo or pocket doped regions 760, 770 at either side of the gate. The dopant implantation concentrations and implantation energies and angles used in forming halo regions 760, 770 are design choices depending upon the type and desired features of FET device. Exemplary ion implantation doses may range anywhere from between $5\times10^{13}$ $cm^{-2}$ to $2\times10^{14}$ $cm^{-2}$ (i.e., implant dosage per square area) at sufficient dose energies to ensure penetration through the gate dielectric layer 730 and stop in the substrate, e.g., 1 keV to about 40 keV, so that the halo extensions form to couple the channel to formed source and drain regions. As will be described, in a second embodiment of the recessed gate structure, source and drain extensions are formed to abut the gate dielectric in a portion of the channel. Thus, the halo regions must be formed to extend beyond the source and drain extensions.

Continuing to FIG. 7E, there is depicted the step of forming spacers 728a,b at respective sides of the gate which requires the deposition of a film of spacer dielectric material 727, e.g., SiN, SiO2, in the opening 711 and performing a directional etch to form the spacers that stop at the surface of the polysilicon gate 720. As shown in FIG. 7F, in a further self-aligned directional etch process, an opening 711' is formed in the polysilicon conductive layer 720. It is within this opening that a metal material is deposited and the structure annealed by processes known in the art, e.g., such as by Rapid Thermal Anneal (RTA), to form a metal silicide 722 contact for the gate electrode 720 as shown in FIG. 7G. It is understood that, if the gate conductor comprises a metal or combination of metals, the need for a silicide contact is obviated and thus the formation of spacers is not necessary.

Continuing to FIG. 7H, in the remaining opening 711 is formed a dielectric material cap 725, e.g., $SiO_2$, sufficient to fill the opening and shown having a top surface aligned with the pad nitride layers. Then, using conventional etching techniques, one or more of the pad nitride layer and underlying oxide layers 715 is stripped to expose openings (not shown) on either side of the middle dielectric material 725 which structure is left in tact. Then, as shown in FIG. 7I, the source diffusion region 740 and drain diffusion region 750 are formed by ion implanting dopant ions 777 at the exposed openings into the substrate surface and then, perform a RTA or other anneal process, such as laser anneal, or furnace anneal. Ion implantation of dopant ions must be at sufficient concentration and energies, so that the depth of the source diffusion region 740 and drain diffusion region 750 is sufficient to contact respective halo regions 760, 770 formed in the substrate that abut the top portion 731 of the gate electrode.

Then in a subsequent step depicted in FIG. 7J, metal silicide contact regions 745, 755 are formed atop the respective source and drain diffusions 740, 750 using conventional techniques of metal deposition and annealing at sufficient conditions. Then, a top dielectric layer 737 is formed on top the whole device structure in preparation for further device processing, e.g., forming vias and gate, source and drain contacts (not shown).

In an alternate embodiment of the invention, the recessed gate FET is characterized as having source and drain regions that do not have to extend as deep due to the provision of source and drain extensions. Thus, after forming the opening 711 as shown in FIG. 7E, a highly doped material 729 such as doped glass or doped silicon dioxide is deposited to fill the opening, as shown in the alternate embodiment of FIG. 7E(1), and, is subject to an anneal condition to outdiffuse the dopant material in high concentration out of the glass material and form adjacent source extension 780 and drain extension 790. As shown in FIG. 7E(1), the source extension 780 and drain extension 790 are formed in respective source and drain halo regions 760, 770 to concentrations ranging from between $5 \times 10^{19}$ cm$^{-3}$ to $1 \times 10^{21}$ cm$^{-3}$. The source and drain extensions 780, 790 provide a low resistance path to the channel from the source and drain diffusions 740, 750 and, because of their formation, enable the source and drain to not have be formed as deep below the substrate surface.

Having formed the vertical self-aligned extensions 780, 790, the process for forming the recess gate device as depicted in FIGS. 7F(1)-7J(1) are the same as the process steps depicted in respective FIGS. 7F-7J as described herein.

Figure 8A:
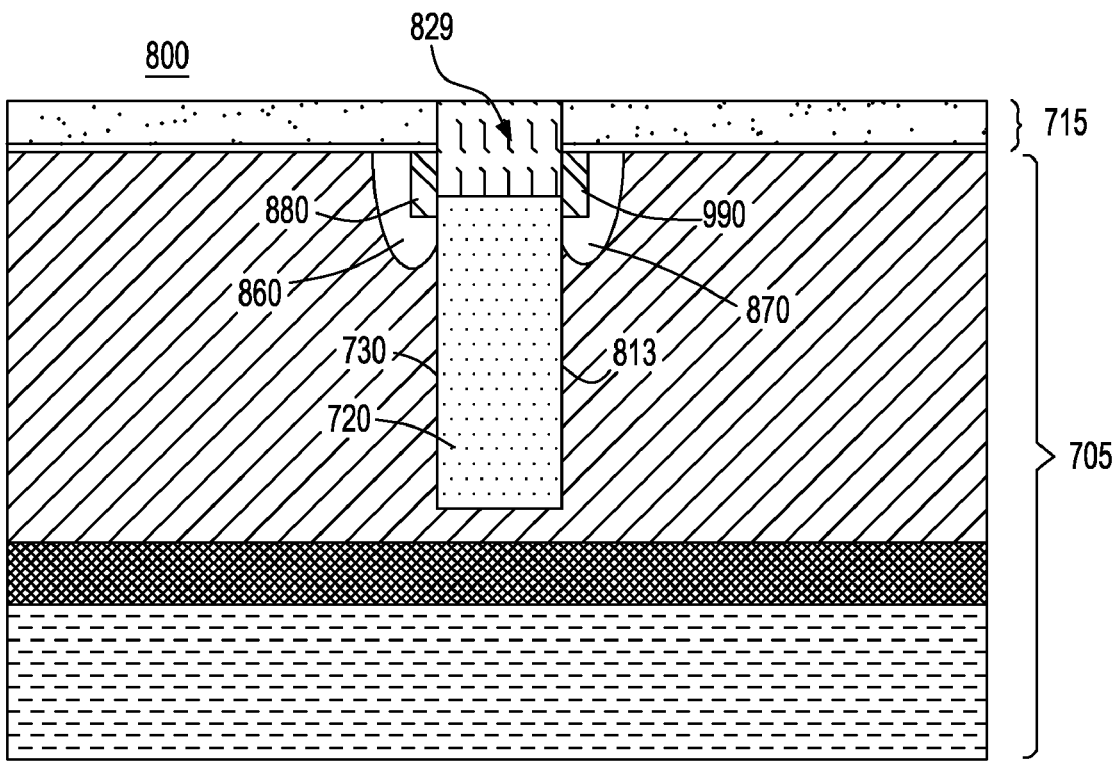
Figure 8B:
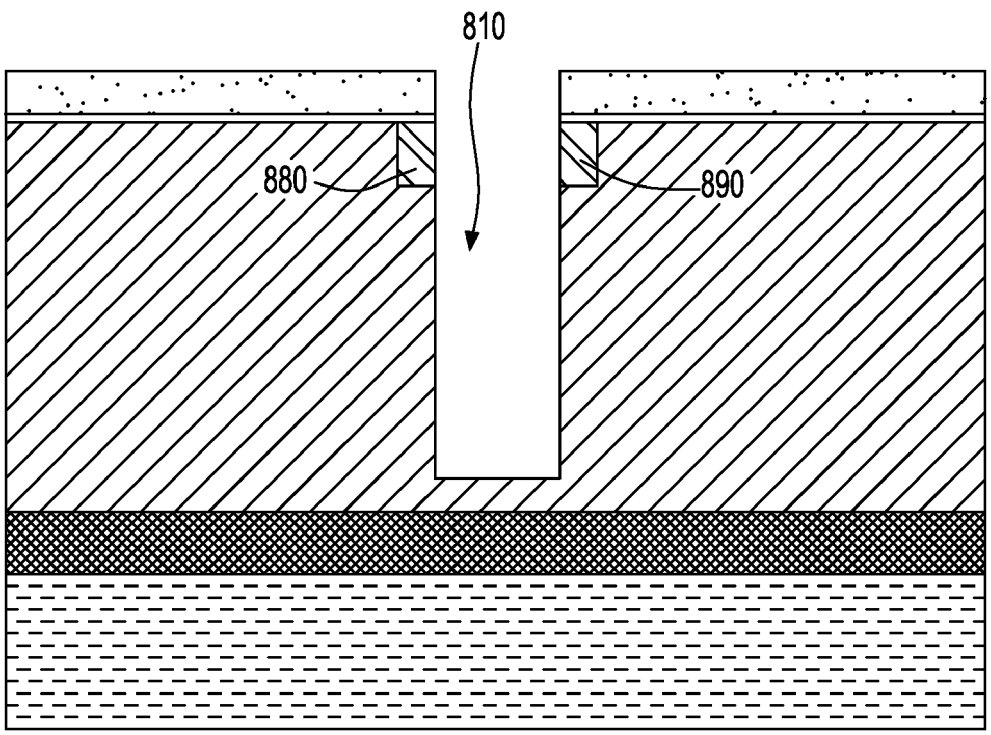

A further embodiment of the inventive method for fabricating the recessed gate FET is depicted in FIGS. 8A-8E. FIG. 8A shows after forming a gate trench 710 as described herein with respect to FIG. 7A, the trench is filled with a sacrificial dielectric material 813 such as an oxide, e.g., SiO$_2$, at a top portion thereof is then recessed (etched back) utilizing Reactive Ion Etching (RIE) etch techniques as known in the art to create an opening (not shown). In the opening is deposited a highly doped glass material 829 which when subjected to proper timing and temperature conditions, will result in the outdiffusion of dopant materials that form highly doped source and drain regions or extensions 880, 890 at concentrations ranging from between $5 \times 10^{19}$ cm$^{-3}$ to $1 \times 10^{21}$ cm$^{-3}$. In another embodiment (not shown), the drain and source extensions may be ion implanted at low energies. The source and drain extensions 880, 890 provide a low resistance path to the channel from the source and drain diffusions as is described herein. Then, as shown in FIG. 8B, with the extension regions 880, 890 in place, the glass 829 is removed as is the sacrificial oxide material 813 to result in the empty gate trench opening 810. It is understood that after removing the doped glass layer 829, in an optional embodiment, an ion implantation technique may be implemented to form the halo (doped pocket) implants 760, 770 as in the prior embodiments.

Figure 8C:
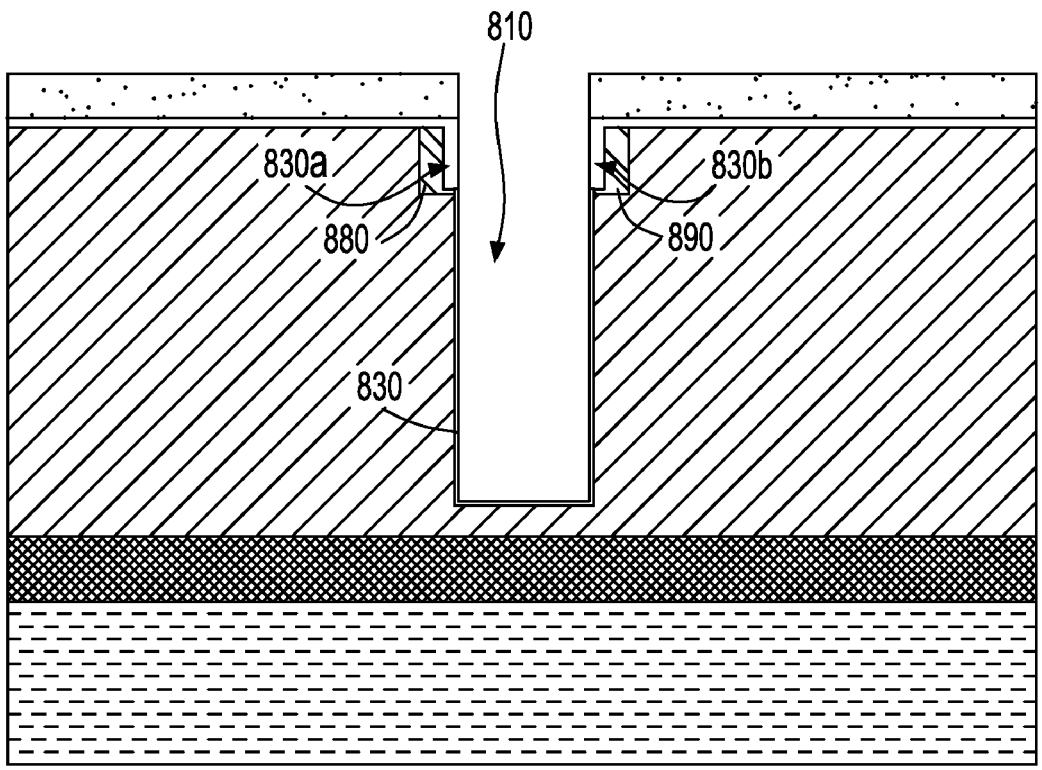

Continuing to FIG. 8C, there is depicted the step of forming a dielectric material lining that will functions as a gate layer dielectric 830. In this embodiment, a thermal oxidation step may be employed which causes formation of a dielectric material, e.g., oxide, formed along all of the interior sidewalls and bottom of the trench 810. As shown in FIG. 2C, the oxidation will grow at a higher rate at areas where doped ions have diffused to from the source/drain extension regions 880, 890 at the side of the gate, thus resulting in a thicker gate dielectric structures 830a, 830b at those locations. These formed gate dielectric structures 830a, 830b function as self-aligned thermal oxide spacers by virtue of their increased thickness location that heavily doped extension regions 880, 890 at the side of the gate. Besides an oxide, it is understood that a nitride or oxynitride gate dielectric layer may be formed at the interior sidewalls and bottom of the trench 810.

Figure 8D:
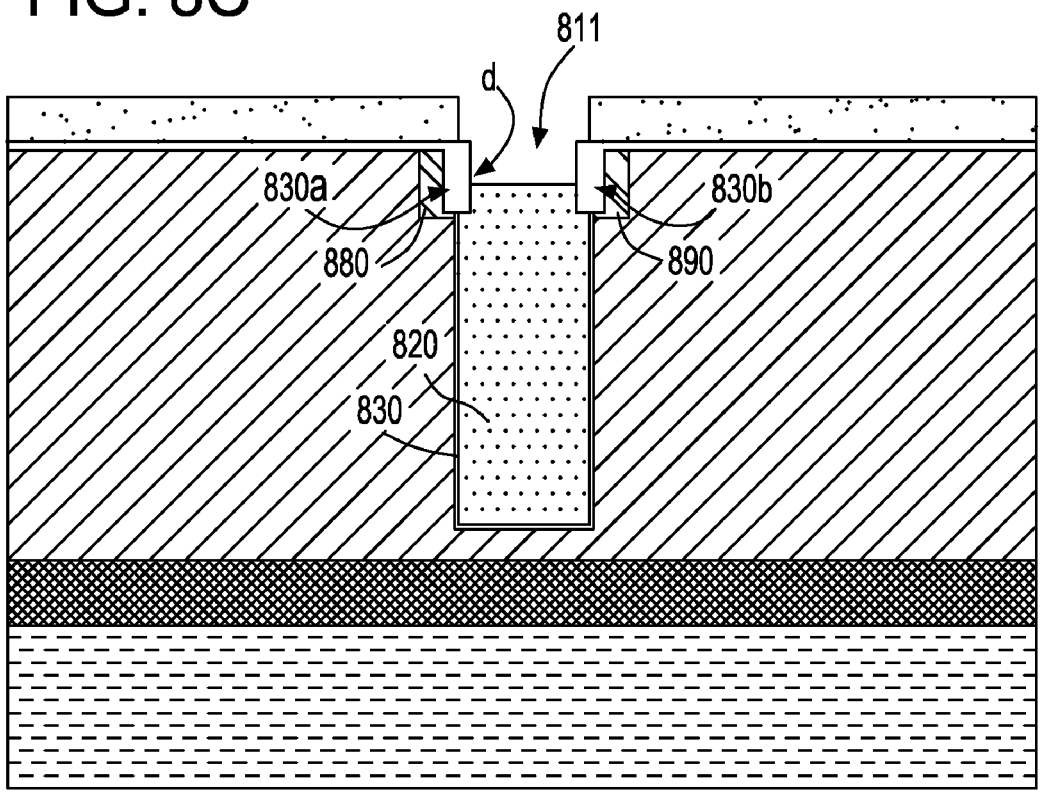
Figure 8E:
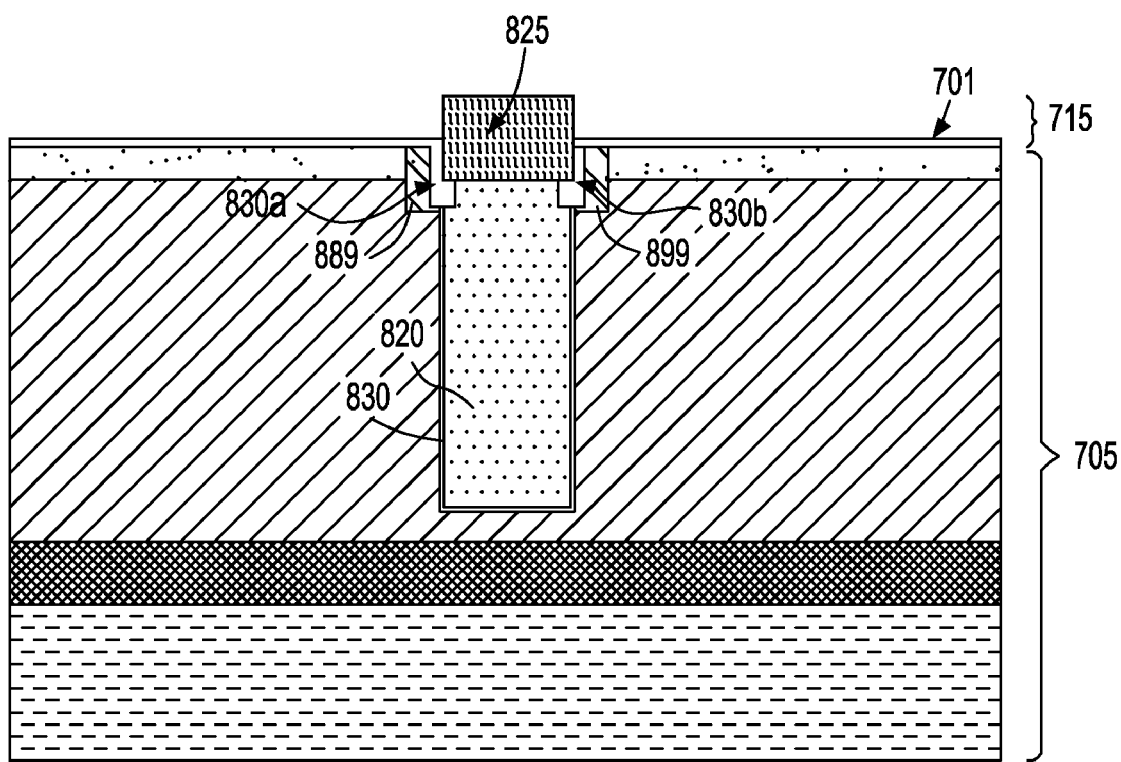

Continuing to FIG. 8D, there is depicted the further step of forming a gate electrode by filling the gate trench 810 lined with dielectric layer 830 with a metal or metal containing conductor material, or, polysilicon 820. For purposes of description it is assumed the conductor material filling the gate trench is polysilicon. The top surface level of the filled polysilicon material (not shown) is then planarized (not shown) and the polysilicon fill is recessed by the small distance "d" as performed in the prior embodiments. Continuing to FIG. 8E, in the opening 811 is formed a dielectric material cap 825, e.g., SiO$_2$, sufficient to fill the opening and having a top surface aligned with the pad nitride layers. Then, using conventional etching techniques, the pad nitride layer of pad layers 715 are stripped to expose openings (not shown) on either side of the dielectric material cap 825 where the source diffusion region and drain diffusion regions are formed by ion implanting dopant ions. Ion implanting of dopant ions to form source and drain diffusions, must be at sufficient concentration and energies, so that the depth of the source diffusion region and drain diffusion region is sufficient to abut top region 831 of the self-aligned thermal oxide spacers. Then in a subsequent step, a top dielectric layer may be formed in preparation for further device processing, e.g., forming gate, source and drain contacts, as in the prior embodiments of the invention.

The recessed gate FET according to each embodiment of the invention is thus more easily scaled to smaller physical dimensions and lower operating voltages than conventional and SOI FETs as the recessed gate with low-Vt corner enables longer channel lengths in finite space. The novel recessed gate FET devices as shown in the embodiments of the invention depicted in FIGS. 5A, 5B and 6A and 6B has a recessed gate which exhibits improved performance as compared to prior art designs by: 1) the ability to control the overlap capacitance (i.e. disclose a replacement for the role played by spacers in planar CMOS); 2) keeping low via resistance without adding excessive gate-to-via capacitance; 3) introducing a gate-edge halo to benefit junction capacitance; and, 4) introducing a structure with source and drain regions orthogonal to the gate.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A recessed gate FET comprising:
   a substrate having an upper doped portion having a first conductivity and a lower doped portion having the first conductivity beneath a substrate surface;
   a gate structure formed within a trench beneath the substrate surface, said gate structure having a gate dielectric surrounding the sidewalls and bottom of said trench, and having a gate conductor present on the gate dielectric and filling the trench, a top surface of said gate conductor being recessed from an upper substrate surface;
   a channel region surrounding the gate structure, and in direct contact with the gate dielectric, wherein the channel region is in contact with the upper doped portion and is in contact with the lower doped portion of the substrate;

source and drain diffusion regions of a second conductivity formed at either side of said gate structure at said substrate surface, wherein the source and drain diffusion regions are in direct contact with a portion of the channel region that is present in the upper doped portion of the substrate, wherein a bottom portion of said trench is formed in said lower doped portion of said substrate, such that said bottom portion of said trench exhibits lower threshold voltage than an upper portion of said trench, said recessed gate FET thereby exhibiting improved suppression of short channel effects.

2. The recessed gate FET of claim 1, where said bottom portion of said trench exhibits lower threshold voltage than said upper portion of said trench by reducing doping concentration of dopant material in said lower doped portion of said substrate than in said upper portion.

3. The recessed gate FET of claim 1, further comprising doped pocket regions formed at either side of and abutting said gate structure, each doped pocket region extending below said source and drain diffusions into said channel region.

4. The recessed gate FET as claimed in claim 1, further comprising: extension regions of highly doped material formed adjacent an upper portion of said gate structure within said doped pocket regions formed at either side of said gate structure to provide a low resistance path to said channel from a respective formed source diffusion and drain diffusion.

5. The recessed gate FET as claimed in claim 1, wherein said top surface of said gate conductor is recessed by an amount relative to said source and drain diffusion regions formed at either side of said gate structure to reduce overlap capacitance between said gate conductor and said source and drain diffusions.

6. The recessed gate FET as claimed in claim 5, wherein an upper surface of said top surface of said gate conductor is recessed below said substrate surface to a depth ranging between 5 nm-50 nm.

7. The recessed gate FET as claimed in claim 1, wherein said recessed gate FET exhibits improved threshold voltage (Vt) characteristics at corners of said trench bottom formed in said lower doped portion of said substrate.

8. The recessed gate FET as claimed in claim 1, wherein said substrate is an Silicon on Insulator (SOI) structure having a buried layer of insulating dielectric material, said gate trench extending to a depth above said buried layer such that a thin substrate portion remains between said buried layer and said gate trench bottom portion.

9. The recessed gate FET as claimed in claim 8, wherein said thin substrate portion is fully depleted.

10. The recessed gate FET as claimed in claim 1, comprising silicide contact regions on top of each source and drain diffusion.

11. The recessed gate FET as claimed in claim 1, further comprising a dielectric cap formed in an opening in said gate trench located above said top surface of said gate conductor.

12. The recessed gate FET as claimed in claim 1, wherein said gate electrode is of a tapered profile.

13. A recessed gate FET comprising:
a substrate having an upper doped portion with a first conductivity and a lower doped portion with the first conductivity beneath a substrate surface;
a gate structure formed within a trench beneath the substrate surface, said gate structure having a gate dielectric surrounding the sidewalls and bottom of said trench, and having a gate conductor present on the gate dielectric and filling the trench, a top surface of said gate conductor being recessed from an upper substrate surface;
a channel region surrounding the gate structure that is within the trench, wherein the channel region is in contact with the upper doped portion and is in contact with the lower doped portion of the substrate;
source and drain diffusion regions of a second conductivity formed at either side of said gate structure at said substrate surface;
source and drain extension regions of highly doped second conductivity material formed adjacent an upper portion of said gate conductor at either side of said gate conductor to provide a low resistance path to said channel region from the source diffusion and the drain diffusion;
wherein a bottom portion of said trench is formed in said lower doped portion of said substrate, such that said bottom portion of said trench exhibits lower threshold voltage than the upper portion of said trench, said recessed gate FET thereby exhibiting improved suppression of short channel effects.

14. The recessed gate FET as claimed in claim 13, wherein said lower doped portion has a reduced concentration of dopant material than said upper doped portion.

15. The recessed gate FET as claimed in claim 13, further comprising: doped pocket regions formed at either side of and abutting said gate structure, each doped pocket region extending below said source and drain diffusions in said channel region, wherein said source and drain extension regions of highly doped material are formed within said doped pocket regions at either side of said gate structure.

16. The recessed gate FET as claimed in claim 13, wherein said top surface of said gate conductor is recessed by an amount relative to said source and drain diffusion regions formed at either side of said gate structure to reduce overlap capacitance between said gate structure and said source and drain diffusions.

17. The recessed gate FET as claimed in claim 16, wherein said top surface of said gate conductor is recessed below said substrate surface to a depth ranging between 5 nm-50 nm.

18. The recessed gate FET as claimed in claim 14, wherein said bottom portion of said trench is formed in said lower doped portion of said substrate, said recessed gate FET thereby exhibiting improved low threshold voltage (Vt) characteristics at corners of said trench bottom.

19. The recessed gate FET as claimed in claim 13, wherein said substrate is a Silicon on Insulator (SOI) structure having a buried layer of insulating dielectric material, said gate trench extending to a depth above said buried layer that a thin substrate portion remains between said buried layer and said gate trench bottom portion.

20. The recessed gate FET as claimed in claim 19, wherein said thin substrate portion is slightly doped or fully depleted.

* * * * *